United States Patent [19]
Uehara et al.

[11] Patent Number: 4,859,832
[45] Date of Patent: Aug. 22, 1989

[54] LIGHT RADIATION APPARATUS

[75] Inventors: Makoto Uehara, Tokyo; Hajime Ichikawa, Yokohama; Masahiko Yomoto, Kawasaki; Shigeru Kato, Hoya, all of Japan

[73] Assignee: Nikon Corporation, Tokyo, Japan

[21] Appl. No.: 92,125

[22] Filed: Sep. 2, 1987

[30] Foreign Application Priority Data

| Sep. 8, 1986 | [JP] | Japan | 61-211208 |
| Dec. 9, 1986 | [JP] | Japan | 61-292887 |
| Jan. 28, 1987 | [JP] | Japan | 62-17786 |
| Jan. 30, 1987 | [JP] | Japan | 62-21383 |
| Mar. 6, 1987 | [JP] | Japan | 62-51480 |
| Mar. 16, 1987 | [JP] | Japan | 62-60659 |
| Mar. 16, 1987 | [JP] | Japan | 62-60660 |
| Mar. 30, 1987 | [JP] | Japan | 62-77033 |
| Mar. 30, 1987 | [JP] | Japan | 62-77034 |
| Mar. 31, 1987 | [JP] | Japan | 62-79495 |
| Apr. 17, 1987 | [JP] | Japan | 62-94593 |
| Apr. 27, 1987 | [JP] | Japan | 62-103989 |

[51] Int. Cl.[4] .......................................... H05B 3/62
[52] U.S. Cl. .................................... 219/411; 219/405
[58] Field of Search .............. 219/405, 411, 354, 347, 219/349, 343; 374/121

[56] References Cited

U.S. PATENT DOCUMENTS

| 3,075,064 | 1/1963 | Bondonio | 219/347 |
| 3,862,397 | 1/1975 | Anderson | 219/343 |
| 4,041,278 | 8/1977 | Boah | 219/411 |
| 4,493,977 | 1/1985 | Arai | 219/211 |

FOREIGN PATENT DOCUMENTS

| 60-131430 | 7/1985 | Japan | 374/121 |
| 61-198735 | 9/1986 | Japan . | |

Primary Examiner—Teresa J. Walberg
Attorney, Agent, or Firm—Shapiro and Shapiro

[57] ABSTRACT

An apparatus for annealing a substrate includes a plurality of annular light sources concentric about a predetermined axis, a holder for placing the substrate such that the substrate receives radiation from the plurality of annular light sources and is substantially perpendicular to the predetermined axis, and a measuring device having a measuring optical system with an optical axis substantially aligned with the predetermined axis. The measuring device is adapted to receive radiation through the measuring optical system from the substrate placed on the holder and to detect a temperature distribution of the substrate.

16 Claims, 29 Drawing Sheets

F I G. 1
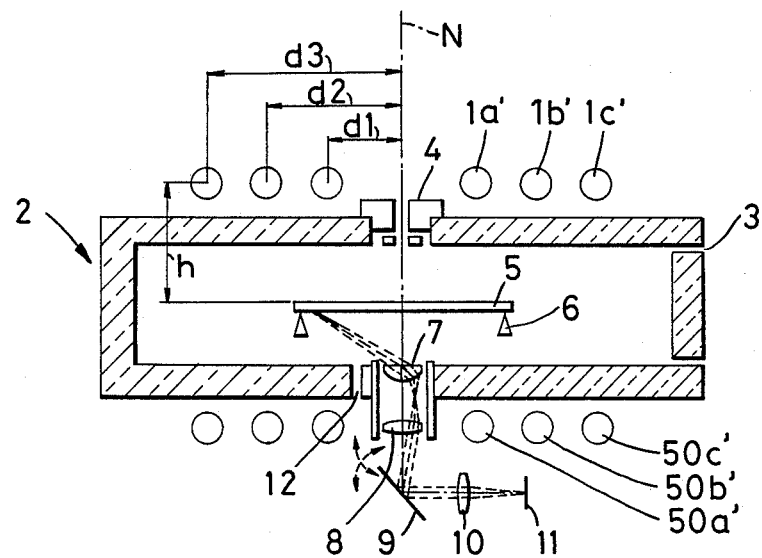
F I G. 2
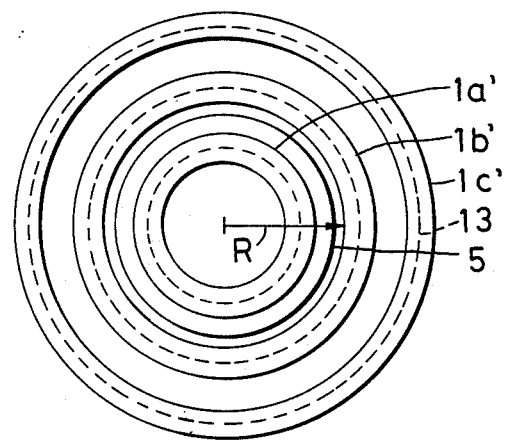

PRIOR ART
FIG. 5 FIG. 6
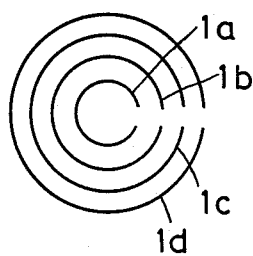
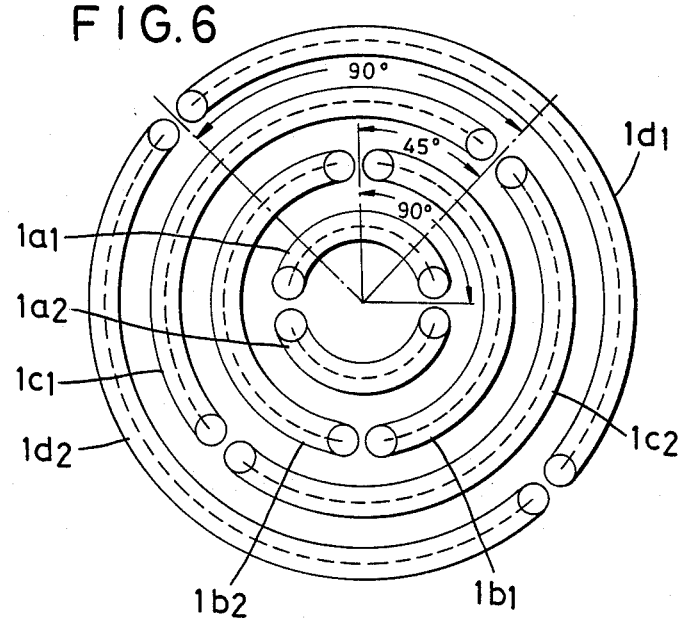
FIG. 7 FIG. 8
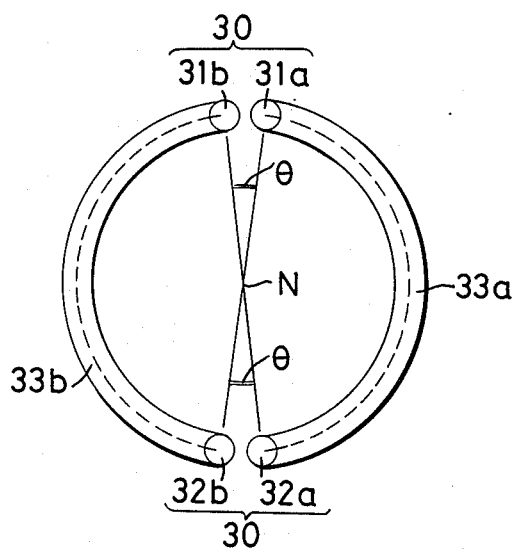
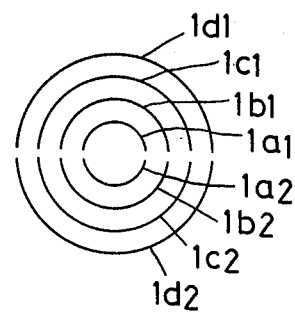

F I G. 21
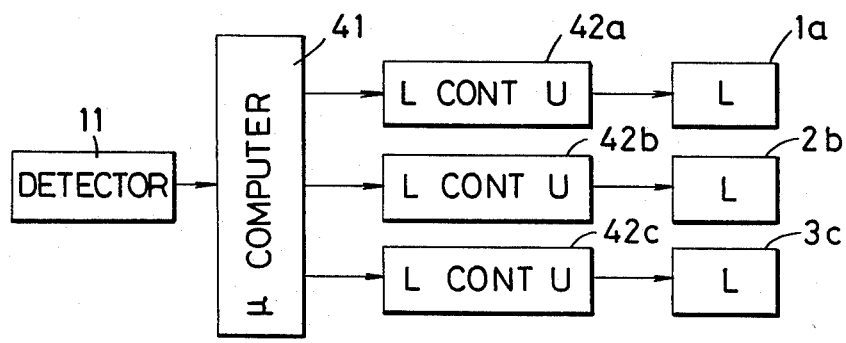
F I G. 22
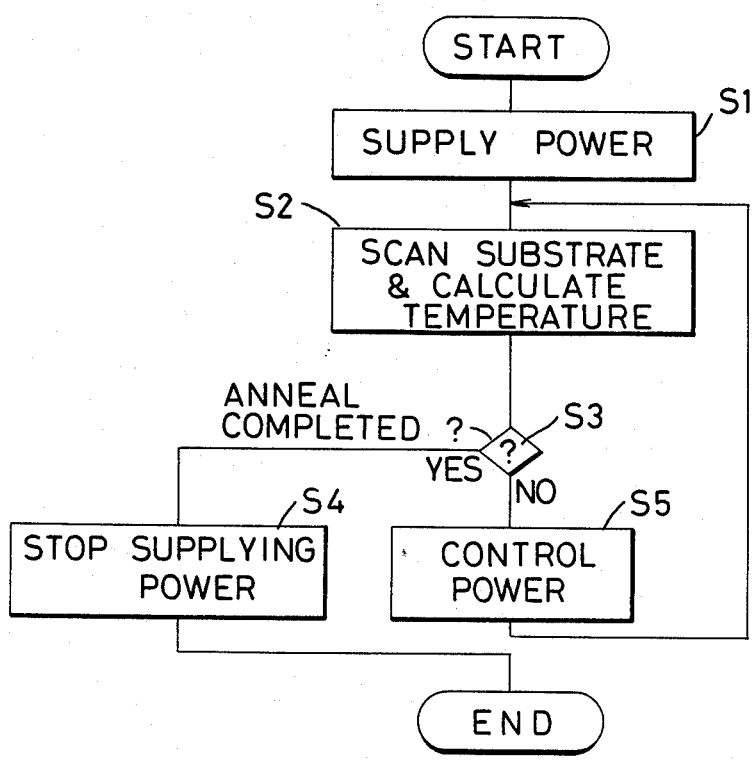

F I G. 36
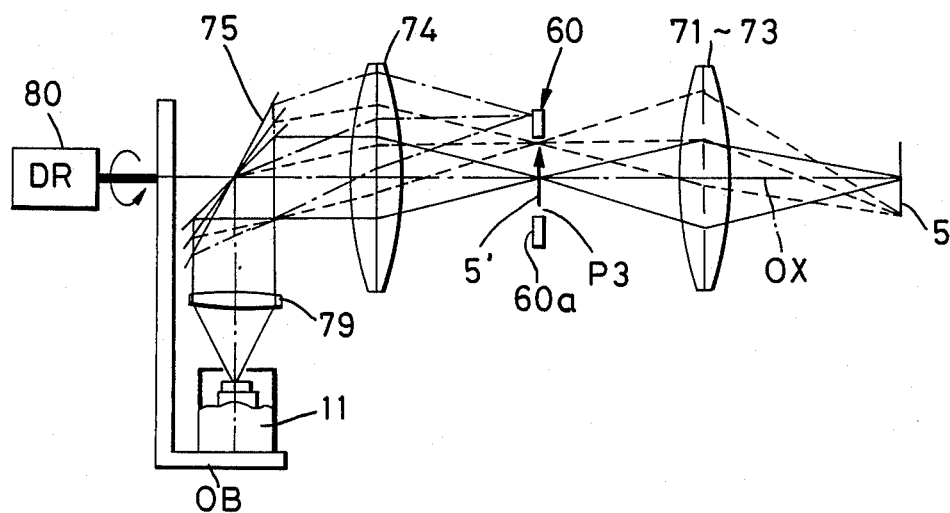
F I G. 37
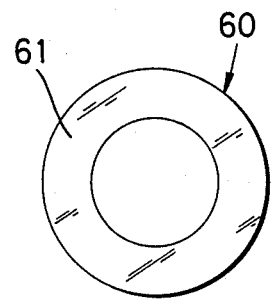

F I G. 38
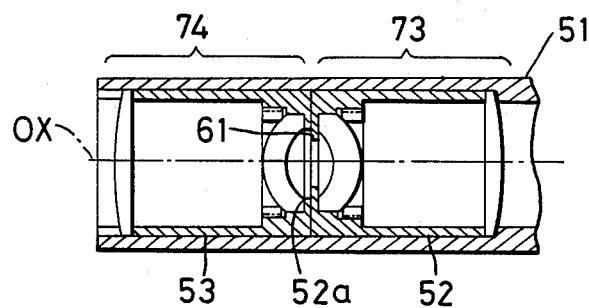
F I G. 39
F I G. 40
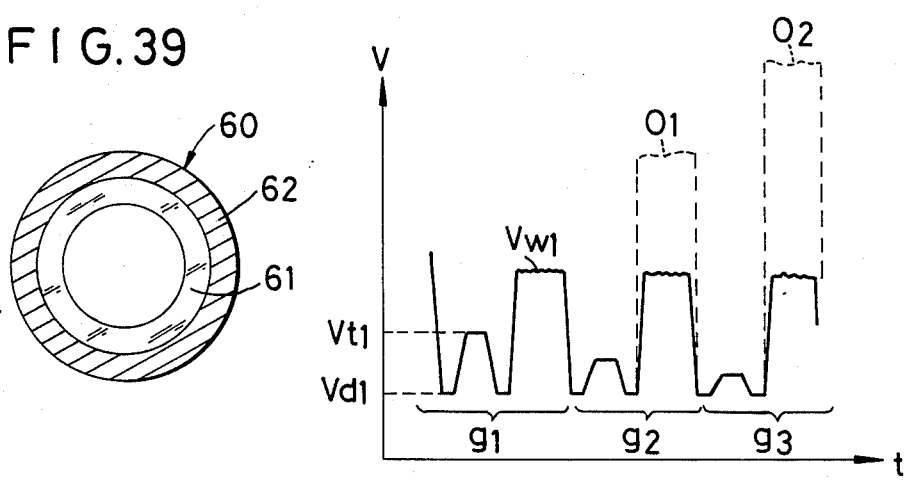

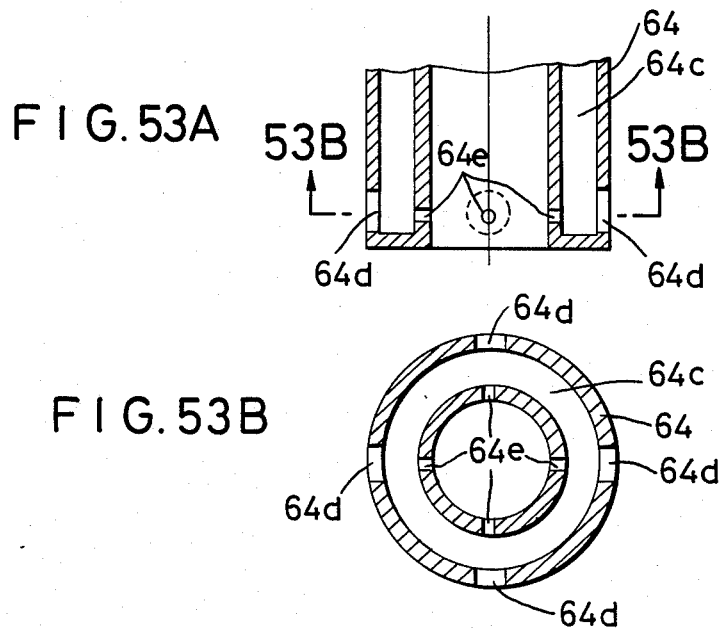
FIG. 53A
FIG. 53B
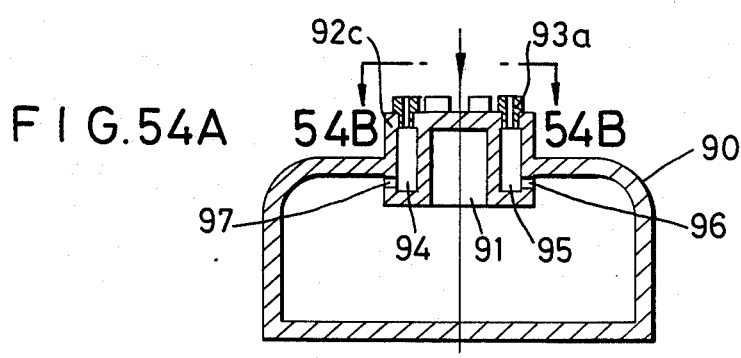
FIG. 54A
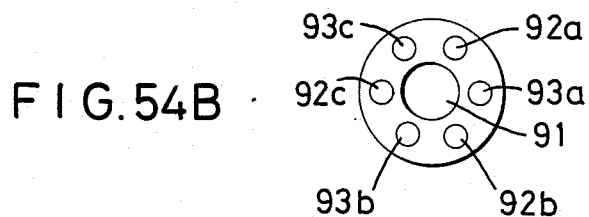
FIG. 54B

LIGHT RADIATION APPARATUS

BACKGROUND OF THE INVENTION

1. Field of the Invention

The present invention relates to a light radiation apparatus such as a lamp annealing apparatus used in the manufacture of semiconductor devices.

2. Related Background Art

Conventional lamp annealing apparatuses are available to heat a wafer to accelerate impurity diffusion, as described in Japanese Patent Application No. 198735/1986.

In the above apparatus, a plurality of annular lamps are concentrically arranged to substantially heat the entire surface of the wafer. A plurality of temperature sensors are arranged above the wafer. The levels of power supplied to the plurality of lamps are controlled in accordance with outputs from the temperature sensors.

In the above apparatus, the entire surface of the wafer cannot be uniformly heated due to problems posed by the shape of lamps, the arrangement of the temperature sensor, and means for supplying power to the lamps.

SUMMARY OF THE INVENTION

It is an object of the present invention to provide a lamp annealing apparatus for precisely uniformly heating the entire surface of a wafer.

BRIEF DESCRIPTION OF THE DRAWINGS

FIG. 1 is a sectional view showing an embodiment using a plurality of concentrically arranged annular light sources;

FIG. 2 is a plan view of the apparatus shown in FIG. 1;

FIG. 5 is a schematic view showing a light source disposition as a comparative arrangement as opposed to the improved arrangement;

FIG. 6 is a plan view showing another improved arrangement of the annular lights sources;

FIG. 7 is a plan view of a pair of semicircular band-like light sources;

FIG. 8 is a schematic view showing a comparative arrangement as opposed to the improved arrangement shown in FIG. 6;

FIG. 21 is a block diagram of a power control system for the light sources;

FIG. 22 is a flow chart for explaining the operation of the power control system for the light sources;

FIG. 36 is a view showing an improved arrangement of an optical system;

FIG. 37 is a front view showing an annular member shown in FIG. 36;

FIG. 38 is a view showing the detailed arrangement of part of the optical system, shown in FIG. 36;

FIGS. 39, 41, and 43 are respectively front views showing improved structures of the annular members 36;

FIGS. 40, 42, and 44 are timing charts showing detector characteristics corresponding to the annular members shown in FIGS. 39, 41, and 43, respectively;

FIGS. 53A and 53B are views showing an improved arrangement of part of the apparatus shown in FIGS. 51A and 51B;

FIGS. 54A and 54B are views showing an improved arrangement of the gas injection apparatus.

DETAILED DESCRIPTION OF THE PREFERRED EMBODIMENTS

Figure 3:
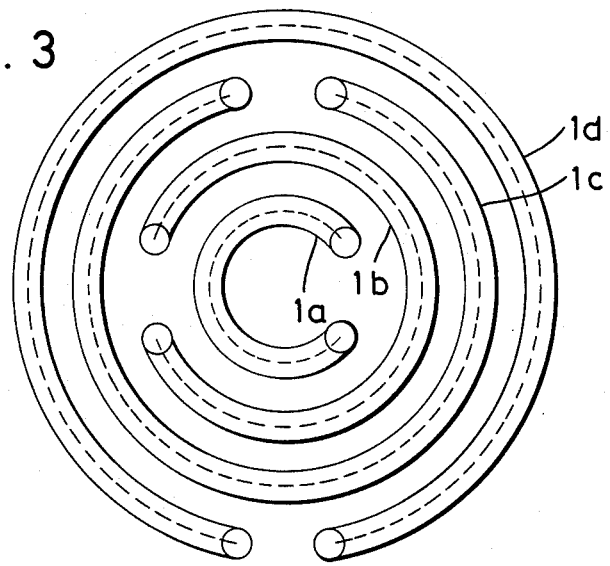
FIG. 3 is a plan view showing an improved arrangement of the plurality of annular light source.

FIG. 1 is a sectional view showing a schematic arrangement of an embodiment of the present invention, and FIG. 2 is a plan view thereof. A wafer 5 as an object to be irradiated with light is supported by a wafer support table 6 and is placed in a chamber 2 which is made of quartz and through which light is transmitted. A plurality of annular heating light sources $1a'$, $1b'$, and $1c'$ and a plurality of annular heating light sources $50a'$, $50b'$, and $50c'$ are concentric about a predetermined axis N and sandwich the chamber 2 on planes parallel to the major two surfaces of the wafer 5. The support table 6 supports the wafer 5 such that the central position of the wafer 5 substantially coincides with the axis N. The wafer 5 is substantially perpendicular to the axis N. Each annular light source may be a halogen lamp with a resistor wire or a flash discharge lamp.

In this embodiment, the chamber 2 has a wafer unload port 3 at the side wall portion, a gas intake port 4 at the upper central wall portion, and a gas exhaust port 12 at the lower central wall portion. A wafer temperature measuring system located in the central space comprises an objective lens 7, a relay lens 8, a scanning mirror 9, a condenser lens 10, and a detector 11. The scanning mirror is two-dimensionally inclined. Of the beams from the entire surface of the wafer 5 to the objective lens 7, some beams from any area are guided to a detector 11. The detector 11 comprises one photoelectric transducer element. Beams reflected by the heated wafer are limited by an aperture (not shown) arranged near the objective lens 7. The beams are focused at an intermediate image formation point and a wafer image is formed thereat. The beams are converted by relay lens 8 into parallel beams, and the parallel beams are reflected at the center of the optical axis of the scanning mirror. The beams are then focused on the detector 11 by the condenser lens 10. With the arrangement of the temperature measuring optical system, temperature measurement can be performed for the entire wafer surface as a surface conjugate with the detector upon changes in angles of the scanning mirror 9.

When a wafer temperature is set at 100° C. to 1,500° C., a wavelength of maximum radiation beams falls within the range of 2 $\mu$m to 8 $\mu$m according to the Wien's displacement law and therefore a detector having sensitivity for the wavelength of at least this bandwidth must be used. Since a halogen lamp or a Xenon flash discharge lamp is generally used as a heating light source, a light source spectrum is greatly reduced at a wavelength of 2 $\mu$m or more. In this case, incidence of light from the light source on the optical system for measuring a wafer temperature must be prevented. For this purpose, a thin film is preferably formed on a lens to reflect a radiation beam (wavelength: 2 $\mu$m or less) passing through the chamber and to transmit a temperature measurement beam (wavelength: 2 $\mu$m to 8 $\mu$m). Alternatively, a dichroic mirror having the same function as described above may be inserted, or a filter is arranged on the light source side to absorb the temperature measurement beam. When heat dissipated from the lens barrel, the aperture, and the like reaches the detector, a temperature measurement error occurs. The temperature measurement portion must be kept at a temperature lower than a temperature falling within the temperature measurement range by means of air or water cooling.

The lamp annealing apparatus is generally subjected to abrupt heating and cooling. The upper and lower surfaces of the wafer must be simultaneously heated to obtain symmetrical heat profiles of these surfaces along the direction of thickness of the wafer, and wafer warping is therefore prevented. In this embodiment, the upper and lower heating annular light sources are arranged substantially symmetrically. The wafer temperature measuring system and the gas exhaust port 12 are provided in the lower central space, and the gas intake port 4 is formed in the upper central space, with the gas medium supplied from the center of the wafer, i.e., on an axis of rotational symmetry. Unlike in the conventional apparatus, uniform reaction of the wafer can be accelerated.

Each lamp in FIG. 2 is illustrated as a perfect circle. However, in practice, slight deformation is required to arrange electrodes. A layout of lamps (annular light sources) for uniformly heating the wafer will be described below. Non-light-emitting portions such as electrodes and spaces between the electrodes of adjacent ones of the concentrically arranged annular light sources should not be aligned on a single radius passing through the center of the concentric circles.

More specifically, radial angular differences between the non-light-emitting portions of the adjacent annular light sources are preferably determined with an alternation of about $\frac{1}{2}$ to about $\frac{1}{4}$ the angle formed by lines connecting the center and both ends of the continuous annular light source. The non-light-emitting portions of the plurality of annular light sources are not aligned on a single radius.

As shown in FIG. 3, if an angle defined by the continuous light-emitting portion between the anode and the cathode of each annular light source is about 360°, radial angular differences of the electrodes of the adjacent annular light sources are alternately 180° and 90°. In this manner, the non-light-emitting portions of the plurality of annular light sources are not aligned on a single radius. The arrangement in FIG. 3 has a larger number of annular light sources than that in FIG. 1. That is, the arrangement in FIG. 3 has light sources $1a$ to $1d$.

Since the electrodes of the plurality of concentrically arranged annular light sources are not aligned on a single radius passing through the center of the concentric circles, the non-light-emitting portions such as the electrodes (e.g., anodes and cathodes) and the spaces therebetween are substantially uniformly distributed in the rotationally symmetrical surface light source, thereby illuminating the wafer more uniformly. Therefore, heating of the wafer with light radiation and excitation of the chemical reactions can be uniformly performed on the entire surface of the wafer.

With the arrangement constituted by a plurality of annular light sources, if the light-emitting level of the inner light sources is lower than that of the outer light sources, the temperature profile of the circular wafer having the center aligned with the axis of rotational symmetry of the light sources exhibits a low level at the center of the wafer and a high level at the peripheral portion thereof. During temperature measurement of the wafer along the radial direction thereof, even if heat dissipation from the peripheral portion of the wafer has a level higher than that from the central portion, the annular light sources are selectively turned on/off to perform closed control, thereby uniformly heating or cooling the entire surface of the wafer.

Figure 4A:
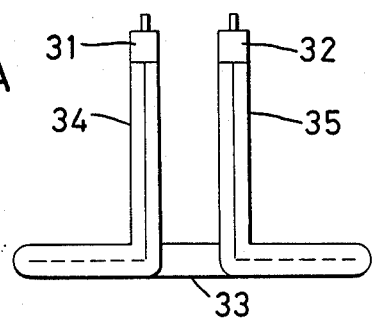
FIG. 4A is a side view showing the annular light source shown in FIG. 3.
Figure 4B:
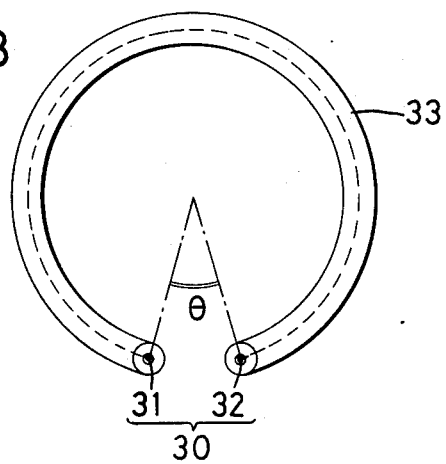
FIG. 4B is a plan view showing the annular light source shown in FIG. 3.

The side view of one of the annular light sources used in the light radiation apparatus according to the present invention is illustrated in FIG. 4A, and a plan view thereof is illustrated in FIG. 4B. The annular light source shown in FIGS. 4A and 4B is the outermost light source 1d shown in FIG. 3. Other annular light sources have the same construction as that of the light source 1d except for diameters. As shown in FIG. 4A, a cathode 31 and an anode 32 of the annular light source 1d are respectively arranged at distal ends of a pair of portions 34 and 35 vertically extending from a surface including a circular light-emitting portion 33 (a quartz tube) constituting the annular light source. The light-emitting portion 33 is a halogen lamp, and a broken line represents a resistor wire. As shown in FIG. 4B, the electrodes 31 and 32 and the space therebetween serve as a non-light-emitting portion 30. Light cannot be emitted from a portion defined by an angle $\theta$ with respect to the center of the annular light source 1d. When the angle $\theta$ of the non-light-emitting portion 30 is small, the illuminance distribution on the surface of the wafer can be uniform. In practice, the distance between the extended portions 34 and 35 cannot be smaller than the diameter of the glass tube constituting the lamp. In addition, a predetermined distance is also required due to the structural limitations of the lamp.

The non-light-emitting portion of one annular light source cannot be eliminated. By combining a plurality of concentrically arranging annular light sources, the illuminance distribution on the surface of the wafer can be more uniform.

As shown in FIG. 3, the non-light-emitting portion of the innermost, i.e., the first annular light source 1a is angularly shifted by 180° from the non-light-emitting portion of the second light source 1b, i.e., the light source adjacent to the innermost annular light source. The non-light-emitting portion of the third annular light source 1c adjacent to the second annular light source 1b is angularly shifted by 90° from the non-light-emitting portion of the second annular light source 1b. The non-light-emitting portion of the fourth annular light source 1d adjacent to the third annular light source is angularly shifted by 180° C. from the non-light-emitting portion of the third annular light source 1c.

An improvement of illumination distribution uniformity by the above disposition of the annular light source according to the present invention will be $ described on the basis of numerical analysis.

Ideal Annular Light Source

Illuminance ratios of a light source (FIG. 2) as the most ideal annular light source having no extended portions (for mounting electrodes) of the light-emitting tube and uniform emission without omissions through 360° are summarized in Table 1. The illuminance ratio is defined as an illuminance of the center ($x=0$ and $y=0$) of the wafer to an illuminance of each area. Table 1 is given under the conditions such that in four annular light sources (represented by a, b, c, and d), a vertical air conversion distance h between the sources and the wafer is 60 mm and radii r of the annular sources are defined as follows:

Radius of Light Source: $r(a)=48$ mm
Radius of Light Source: $r(b)=68$ mm
Radius of Light Source: $r(c)=90$ mm
Radius of Light Source: $r(d)=112$ mm The loads acting on the respective annular light sources are identical, and the emission amounts per unit length in the respective annular light sources are also identical. The wafer as the object irradiated with light has a diameter of 6" (150 mm). The illuminance ratios of the center of the wafer to points on the wafer surface are given at pitches of 15 mm and represent illuminance distributions along the x- and y-axes as shown.

TABLE 1

| y | x | | | | | | | | | | |
|---|---|---|---|---|---|---|---|---|---|---|---|
| | −75 | −60 | −45 | −30 | −15 | 0 | 15 | 30 | 45 | 60 | 75 |
| 75 | | | | | | 1.005 | | | | | |
| 60 | | | | 1.032 | 1.044 | 1.048 | 1.044 | 1.032 | | | |
| 45 | | | 1.041 | 1.054 | 1.055 | 1.054 | 1.055 | 1.054 | 1.040 | | |
| 30 | | 1.032 | 1.054 | 1.052 | 1.041 | 1.035 | 1.040 | 1.051 | 1.053 | 1.031 | |
| 15 | | 1.045 | 1.055 | 1.041 | 1.020 | 1.011 | 1.020 | 1.040 | 1.054 | 1.043 | |
| 0 | 1.005 | 1.048 | 1.054 | 1.035 | 1.011 | 1.000 | 1.010 | 1.034 | 1.053 | 1.046 | 1.002 |
| −15 | | 1.045 | 1.055 | 1.041 | 1.020 | 1.011 | 1.020 | 1.040 | 1.054 | 1.043 | |
| −30 | | 1.032 | 1.054 | 1.052 | 1.041 | 1.035 | 1.040 | 1.051 | 1.053 | 1.031 | |
| −45 | | | 1.041 | 1.054 | 1.055 | 1.054 | 1.055 | 1.054 | 1.040 | | |
| −60 | | | | 1.032 | 1.044 | 1.048 | 1.044 | 1.032 | | | |
| −75 | | | | | | 1.005 | | | | | |

In illuminance calculations, the light source is assumed as a light source of perfect diffusion, and the illuminance is in inverse proportion to the square of the distance from the light source and is proportional to a cosine of an incident angle, so that values were integrated for all light sources.

A maximum numerical integration error is about 0.2%. As shown in Table 1, the illuminance is increased by about 5% from the center of the wafer surface to its peripheral portion. The outermost portion has substantially the same rotationally symmetrical illuminance distribution as that of the central portion. Such illuminance variations change in accordance with the number of light sources, the radii of light sources, the distances from the wafer, and the loads acting on the light sources. By controlling the loads of the concentrically arranged annular light sources, a uniform illuminance distribution can be obtained. In the present invention, the illuminance distribution of the light sources shown in FIG. 3 is compared with the reference illuminance distribution shown in Table 1. This comparison aims at comparing the illuminances within the wafer surface with their distribution. Therefore, an assumption is made that radiation is from one side of the wafer.

Arrangement of FIG. 3

The illuminance distribution of the arrangement constituted by the annular light sources (FIG. 3) according to the present invention is shown in Table 2. In illuminance calculations, the four concentrically arranged annular light sources 1a, 1b, 1c, and 1d are arranged at positions corresponding to the vertical air conversion distance h=60 mm up to the wafer. Radii r of the respective annular light sources are the same as for Table 1. The length of the non-light-emitting portion of each annular light source is given as 20 mm, and identical loads are respectively applied to the annular light sources.

As shown in Table 2, a very uniform illuminance distribution can be obtained and is substantially the same as that (Table 1) of the ideal annular light source. The rotationally asymmetrical illuminance variations fall within the range of ±1%, and a standard deviation $\sigma$ is as small as 0.00738. When the ideal annular light sources are used and the loads applied to the respective annular light sources are changed to obtain a uniform illuminance distribution, the illuminance distribution variations fall within the range of ±1%, although the non-light-emitting portion is inevitably formed in a practical annular light source.

ranged annular light sources is the same as described above. The radii and lengths of the non-light-emitting portions of the annular light sources are the same as described above.

In this case, the illuminance distribution is given in Table 3. The illuminance on the wafer surface is decreased by about 10% in the radial direction along which the positions of the non-light-emitting portions are aligned. However, the illuminance on the opposite side (left side with respect to the center of FIG. 5) substantially free from the influence of the non-light-emitting portion is increased by about 4%. A total standard deviation $\sigma$ is as large as 0.3621. Thus the illuminance variations greatly depend on the positions of the non-light-emitting portions. The rotationally asymmetrical illuminance variations cannot be corrected even if loads acting on the annular light sources are controlled.

When the contents of Table 2 showing the illuminance distribution of the embodiment of the present invention are compared with those of Table 3, the arrangement according to the present invention indicated how uniform illuminance distribution is obtained.

TABLE 3

| y | x |  |  |  |  |  |  |  |  |  |  |
|---|---|---|---|---|---|---|---|---|---|---|---|
|  | −75 | −60 | −45 | −30 | −15 | 0 | 15 | 30 | 45 | 60 | 75 |
| 75 |  |  |  |  |  | 1.028 |  |  |  |  |  |
| 60 |  |  |  | 1.034 | 1.029 | 1.023 | 1.016 | 1.007 |  |  |  |
| 45 |  |  | 1.036 | 1.032 | 1.025 | 1.017 | 1.006 | 0.994 | 0.981 |  |  |
| 30 |  | 1.039 | 1.035 | 1.029 | 1.021 | 1.009 | 0.994 | 0.977 | 0.960 | 0.945 |  |
| 15 |  | 1.038 | 1.034 | 1.027 | 1.017 | 1.003 | 0.984 | 0.962 | 0.941 | 0.922 |  |
| 0 | 1.041 | 1.038 | 1.034 | 1.027 | 1.016 | 1.000 | 0.980 | 0.956 | 0.933 | 0.913 | 0.898 |
| −15 |  | 1.038 | 1.034 | 1.027 | 1.017 | 1.003 | 0.984 | 0.963 | 0.942 | 0.923 |  |
| −30 |  | 1.039 | 1.053 | 1.029 | 1.021 | 1.010 | 0.995 | 0.978 | 0.961 | 0.946 |  |
| −45 |  |  | 1.036 | 1.032 | 1.026 | 1.017 | 1.007 | 0.995 | 0.982 |  |  |
| −60 |  |  |  | 1.034 | 1.030 | 1.024 | 1.016 | 1.008 |  |  |  |
| −75 |  |  |  |  |  | 1.029 |  |  |  |  |  |

$\sigma = 0.03621$

An improved arrangement of the annular light source will be described. In the improved arrangement, each of the plurality of annular light sources is constituted by a combination of a plurality of arcuate light sources. A radial position of the non-light-emitting portion between the plurality of arcuate light sources constituting one annular light source differs from that of the non-

TABLE 2

| y | x |  |  |  |  |  |  |  |  |  |  |
|---|---|---|---|---|---|---|---|---|---|---|---|
|  | −75 | −60 | −45 | −30 | −15 | 0 | 15 | 30 | 45 | 60 | 75 |
| 75 |  |  |  |  |  | 0.991 |  |  |  |  |  |
| 60 |  |  |  | 1.004 | 1.000 | 0.997 | 0.999 | 1.004 |  |  |  |
| 45 |  |  | 1.007 | 1.005 | 1.003 | 1.001 | 1.001 | 1.003 | 1.007 |  |  |
| 30 |  | 1.002 | 1.003 | 1.004 | 1.003 | 1.002 | 1.000 | 0.999 | 1.001 | 1.007 |  |
| 15 |  | 0.995 | 0.998 | 1.001 | 1.002 | 1.000 | 0.997 | 0.994 | 0.995 | 1.001 |  |
| 0 | 0.992 | 0.992 | 0.996 | 1.000 | 1.002 | 1.000 | 0.996 | 0.992 | 0.993 | 0.999 | 1.009 |
| −15 |  | 0.996 | 0.999 | 1.003 | 1.004 | 1.003 | 0.999 | 0.996 | 0.997 | 1.002 |  |
| −30 |  | 1.003 | 1.005 | 1.008 | 1.008 | 1.007 | 1.005 | 1.004 | 1.005 | 1.009 |  |
| −45 |  |  | 1.011 | 1.011 | 1.011 | 1.010 | 1.010 | 1.010 | 1.012 |  |  |
| −60 |  |  |  | 1.012 | 1.011 | 1.010 | 1.010 | 1.012 |  |  |  |
| −75 |  |  |  |  |  | 1.004 |  |  |  |  |  |

$\sigma = 0.00738$

Arrangement of FIG. 5

According to the embodiment described above, uniform illuminance distribution can be obtained. As a comparison, an illuminance distribution is calculated in which non-light-emitting portions of the plurality of annular light sources shown in Japanese Patent Laid-Open No. 61-198735 are aligned in the radial direction, as shown in FIG. 5. The vertical air conversion distance h between the wafer and the four concentrically arlight-emitting portion between the plurality of arcuate light sources constituting another annular light source.

Radial angular differences between positions of non-light-emitting portions (connecting portions of the arcuate light sources) of the adjacent annular light sources are repeated as about ½ and about ¼ the angle defining the length of the light-emitting portion of the annular light source. In addition, the non-light-emitting portions of the adjacent annular light sources are shifted by about ½ the angle defining the light-emitting portion of the arcuate light sources constituting the annular light sources. As a result, the non-light-emitting portions of the adjacent annular light sources are not aligned along the radial direction.

As shown in FIGS. 6, annular light sources 1a, 1b, 1c, and 1d are constituted by semicircular light sources. The innermost annular light source 1a comprises two semicircular light sources 1a1 and 1a2. The second annular light source 1b comprises two semicircular light sources 1b1 and 1b2. The third annular light source 1c comprises two semicircular light sources 1c1 and 1c2. The outermost or fourth annular light source 1d comprises two semicircular light sources 1d1 and 1d2.

When the heating annular light source sets are arranged above and below the wafer in a symmetrical manner, the positions of the non-light-emitting portions of the upper set are preferably shifted from the positions of the non-light-emitting portions of the lower set, thereby further decreasing the influence of the non-light-emitting portions of the annular light source sets.

The two semicircular light sources constituting one of the annular light sources used in the light. radiation apparatus described above are illustrated in the plan view of FIG. 7. FIG. 7 illustrates only one annular light source. Other annular light sources have the same arrangement as that illustrated in FIG. 7, except for diameters. The two semicircular light sources constituting one annular light source have light-emitting portions 33a and 33b each having a length corresponding to about 180°. Electrodes 31a and 32a, 31b, and 32b of the two semicircular light sources and the spaces therebetween constitute non-light-emitting portions 30.

As shown in FIG. 6, the angular position of each non-light-emitting portion of the innermost or first annular light source constituted by the arcuate light sources 1a1 and 1b1 is shifted by 90° from a corresponding portion of the second annular light source constituted by the arcuate light sources 1b1 and 1b2. The angular position of each non-light-emitting portion of the third annular light source constituted by the arcuate light sources 1c1 and 1c2 is shifted by 45° from a corresponding portion of the third light source constituted by the arcuate light sources 1c1 and 1c2. The angular position of each non-light-emitting portion of the fourth annular light source is shifted by 90° from a corresponding portion of the fourth annular light source.

When the circular light source means is constituted by the plurality of concentrically arranged annular light sources, angular differences between the radial positions of the non-light-emitting portions between the plurality of arcuate light sources constituting one annular light source and the radial positions of the non-light-emitting portions between the plurality of arcuate light sources constituting another annular light source may be about ½ the angle corresponding to the length of the continuous light-emitting portion of the annular light source.

As shown in the above embodiment, for example when one annular light source is constituted by two semicircular light sources, the non-light-emitting portions of one annular light source are angularly spaced part by about 180°. The radial angular positions of the non-light-emitting portions of the adjacent annular light sources can be shifted by 90° to obtain a good effect.

Three arcuate light-emitting portions for example having a length corresponding to about 120° may be combined to constitute one annular light source. Again, the non-light-emitting portions should not be aligned in the radial direction. For this purpose, the angular positions of the non-light-emitting portions as connecting portions of the arcuate light sources constituting each annular light source are shifted by 60° to obtain a good effect.

Furthermore, when a plurality of annular light sources are combined to constitute a concentric light source means, each inner annular light source may be constituted by two semicircular light sources and each outer annular light source may be constituted by a combination of three arcuate light sources having light-emitting portions each having a length corresponding to an angle of about 120°. Alternatively, four actuated light sources having light-emitting portions each having a length corresponding to an angle of about 90° may be combined to constitute one annular light source. With this arrangement, the lengths of the plurality of arcuate light sources constituting each annular light source can be identical. Therefore, the arrangement of the light source control units can be simplified since the loads to be applied to the respective arcuate light sources are identical.

The illuminance distribution of the above improved arrangement will be described according to numerical analysis.

Arrangement of FIG. 6

The illuminance distribution of the improved arrangement of the annular light sources shown in FIG. 6 is summarized in Table 4. The radii of the first, second, third, and fourth annular light sources are defined for the same manner as in Tables 1, 2, and 3.

TABLE 4

|     | −75   | −60   | −45   | −30   | −15   | 0     | 15    | 30    | 45    | 60    | 75    |
|-----|-------|-------|-------|-------|-------|-------|-------|-------|-------|-------|-------|
| 75  |       |       |       |       |       | 1.002 |       |       |       |       |       |
| 60  |       |       |       | 1.005 | 1.002 | 1.001 | 1.001 | 1.001 |       |       |       |
| 45  |       |       | 1.006 | 1.005 | 1.002 | 1.001 | 1.001 | 1.001 | 1.001 |       |       |
| 30  |       | 1.008 | 1.005 | 1.003 | 1.002 | 1.001 | 1.001 | 1.001 | 1.002 | 1.005 |       |
| 15  |       | 1.006 | 1.003 | 1.001 | 1.001 | 1.000 | 1.000 | 1.000 | 1.002 | 1.006 |       |
| 0   | 1.010 | 1.005 | 1.001 | 0.999 | 1.000 | 1.000 | 1.000 | 1.000 | 1.002 | 1.007 | 1.013 |
| −15 |       | 1.004 | 1.001 | 1.000 | 1.000 | 1.001 | 1.001 | 1.002 | 1.004 | 1.008 |       |
| −30 |       | 1.004 | 1.002 | 1.001 | 1.001 | 1.002 | 1.003 | 1.005 | 1.007 | 1.010 |       |
| −45 |       |       | 1.002 | 1.001 | 1.001 | 1.002 | 1.004 | 1.006 | 1.008 |       |       |
| −60 |       |       |       | 1.002 | 1.002 | 1.002 | 1.004 | 1.006 |       |       |       |
| −75 |       |       |       |       |       | 1.003 |       |       |       |       |       |

$\sigma = 0.00281$

In illuminance calculations, the concentric light source apparatus having concentric four pairs of semicircular light sources (1a1 and 1a2, 1b1 and 1b2, 1c1 and 1c2, and 1d1 and 1d2) shown in FIG. 6 has a vertical air conversion distance h=60 mm between the sources and the wafer. The lengths of the non-light-emitting portions are 100 mm each.

As shown in Table 4, a very uniform illuminance distribution can be obtained and is substantially the same as that of the ideal annular light sources (Table 1). The rotational asymmetrical illuminance variations fall within the range of +1.3% to −0.1%, and a standard deviation is as very small as $\sigma=0.00281$. Therefore, if the ideal annular light sources are used and loads to be applied to the respective annular light sources are changed to obtain a state free from illuminance variations, the illuminance distribution variations fall within the range of about ±1% although a non-light-emitting portion is inevitably formed in the actual annular light source.

Arrangement of FIG. 8

As a comparison, an illuminance distribution is calculated when two semicircular light sources are combined to constitute one annular light source and have non-light-emitting elements aligned along the radial direction, as shown in FIG. 8. The vertical air conversion distance h between the four concentrically arranged annular light sources and the wafer and the radii of the annular light sources are the same as those in the previous embodiments. The lengths of the non-light-emitting portions of the annular light sources are 10 mm each.

As shown in Table 5, the illuminance distribution variations fall within the range of about ±3%, and a standard deviation is as large as $\sigma=0.01536$.

When the contents of Table 4 representing the distribution of the improved arrangement is compared with those of Table 5 representing the distribution of the comparative example, it is evident that a more uniform illuminance distribution can be obtained by the improved arrangement.

proving illumination efficiency. In addition, the concave mirrors are designed for at least the outermost one of the concentrically arranged annular light sources in such a manner that the illuminance of the peripheral portion of the wafer surface is increased by the concave mirrors. Therefore, the temperature of the peripheral portion of the wafer which tends to be decreased by heat dissipation can be compensated.

Most of the beams which are not directly incident on the wafer are preferably controlled by the annular mirrors arranged behind the annular light sources, so that the beams from the inner annular light source can be used for uniform radiation while the beams from the outermost annular light source are concentrated on the peripheral portion of the wafer. The entire surface of the wafer can be heated with optical energy given by these radiation conditions, and the entire surface of the wafer can be uniformly heated.

The concentric annular light source sets are arranged above and below the surfaces of the chamber, and the light-emitting weights of the angular light sources are set identical. Thus the entire surface of the wafer can be substantially uniformly irradiated with light. An illuminance obtained by beams directly emitted from the four annular light sources can be a value calculated by conditions shown in Table 6. Therefore, a substantially uniform illuminance distribution shown in Table 7 can be obtained. It should be noted that radii of the annular light sources 1a to 1d and the distance between the wafer and the light sources are the same as for Tables 1 to 3.

TABLE 6

|  | Light Source Length (mm) |
| --- | --- |
| Light Source 1a | 302 |
| Light Source 1b | 427 |
| Light Source 1c | 553 |
| Light Source 1d | 679 |
| Total Light Source Length | 1961 |

TABLE 5

| y | x |  |  |  |  |  |  |  |  |  |  |
| --- | --- | --- | --- | --- | --- | --- | --- | --- | --- | --- | --- |
|  | −75 | −60 | −45 | −30 | −15 | 0 | 15 | 30 | 45 | 60 | 75 |
| 75 | z |  |  |  |  | 1.028 |  |  |  |  |  |
| 60 |  |  |  | 1.021 | 1.023 | 1.023 | 1.023 | 1.021 |  |  |  |
| 45 |  |  | 1.009 | 1.013 | 1.016 | 1.017 | 1.016 | 1.013 | 1.009 |  |  |
| 30 |  | 0.992 | 0.998 | 1.004 | 1.008 | 1.009 | 1.008 | 1.003 | 0.998 | 0.992 |  |
| 15 |  | 0.980 | 0.987 | 0.995 | 1.001 | 1.027 | 1.000 | 0.995 | 0.987 | 0.980 |  |
| 0 | 0.969 | 0.975 | 0.983 | 0.991 | 0.998 | 1.000 | 0.998 | 0.991 | 0.983 | 0.975 | 0.969 |
| −15 |  | 0.980 | 0.988 | 0.995 | 1.001 | 1.028 | 1.001 | 0.995 | 0.988 | 0.980 |  |
| −30 |  | 0.992 | 0.998 | 1.004 | 1.008 | 1.010 | 1.008 | 1.004 | 0.998 | 0.993 |  |
| −45 |  |  | 1.009 | 1.013 | 1.016 | 1.017 | 1.016 | 1.013 | 1.010 |  |  |
| −60 |  |  |  | 1.021 | 1.023 | 1.024 | 1.023 | 1.021 |  |  |  |
| −75 |  |  |  |  |  | 1.029 |  |  |  |  |  |

$\sigma = 0.01536$

Figure 9:
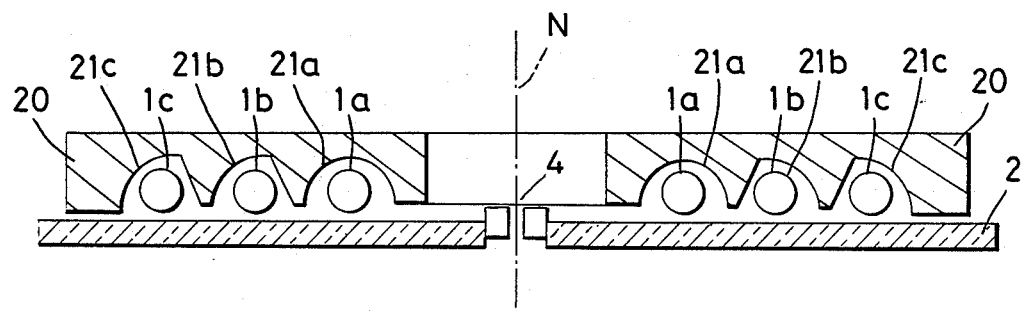
FIG. 9 is a schematic view showing an arrangement of annular mirrors in the apparatus according to the present invention.

A reflecting member 20 arranged behind the concentrically arranged annular light sources in an embodiment of the present invention will be described with reference to FIG. 9. The reflecting member is designed such that an illuminance at the peripheral portion of the wafer is increased by concave mirrors with respect to at least an outermost one of the plurality of annular light sources.

More specifically, the annular concave mirror for at least the outermost annular light source is designed such that the light-emitting portion of the light sauce is displaced from the optical axis of the concave mirror when viewed from a plane passing through the center of the concentric circles.

Since the reflecting member is located behind the concentrically arranged annular light sources, beams which does not directly reach the surface of the wafer can be reflected by the reflecting member, thereby im-

TABLE 7

| Distance from Wafer Center | 0.0 mm | 7.5 mm | 15 mm | 22.5 mm |
| --- | --- | --- | --- | --- |
| Illuminance Ratio | 1.000 | 1.002 | 1.010 | 1.021 |
| Distance from Wafer Center | 30 mm | 37.5 mm | 45 mm | 52.5 mm |
| Illuminance Ratio | 1.035 | 1.048 | 1.057 | 1.058 |
| Distance from Wafer Center | 60 mm | 67.5 mm | 75 mm |  |
| Illuminance Ratio | 1.051 | 1.034 | 1.005 |  |

The radiation conditions for the central portion of the wafer may differ greatly from those for the peripheral portion thereof. The temperature of the peripheral portion tends to be greatly reduced. As show in FIG. 9, in order to compensate for the decrease in temperature due to heat dissipation, reflecting member 20 is arranged behind the annular light source, i.e., to oppose the upper surface of the chamber 2. A reflecting member having the same shape as that of the member 20 is arranged on the lower surface side of the chamber 2 behind the annular light sources. However, FIG. 9 illustrates only the reflecting member opposite to the upper surface of the chamber 2. The reflecting member 20 comprises three concentrically arranged annular mirrors 21a, 21b, and 21c respectively corresponding to the annular light sources. In this case, the wafer surface is substantially uniformly illuminated by the beams directly emitting from the annular light sources to the wafer. Beams which do not directly reach the wafer surface and that are guided by reflection by means of the reflecting member are adapted such that the reflected beams from the inner annular light source are used to substantially uniformly irradiate the entire surface of the wafer and the light beams from the outer annular light source are primarily concentrated on the peripheral portion of the wafer. More specifically, of the beams from the inner annular light source 1a, beams which are not directly incident on the wafer are reflected by the annular mirror 21a to substantially uniformly irradiate the entire surface of the wafer. Of the beams from the middle and outer annular light sources 1b and 1c, the beams which are not directly incident on the wafer are reflected by the annular mirrors 21b and 21c and are concentrated on the peripheral portion of the wafer.

So that the beams from the outer annular light source are reflected and concentrated on the peripheral portion of the wafer, the positional relationship between the annular mirrors and the annular light sources will be described with reference to FIGS. 10 to 13.

Figure 10:
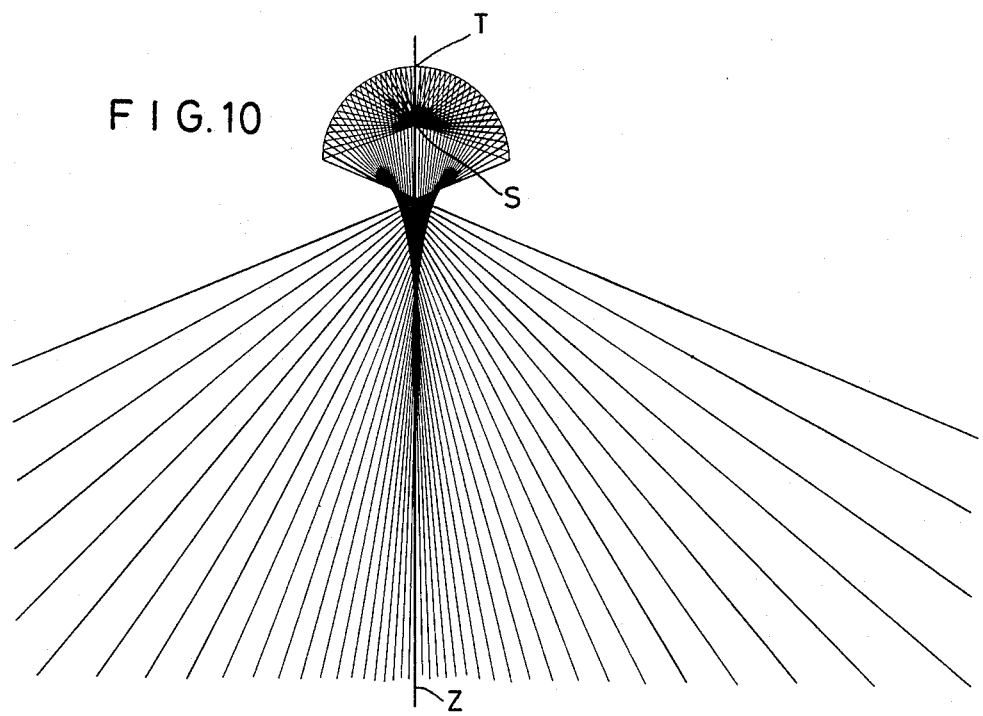
FIGS. 10, 11, 12, and 13 are views showing optical paths for reflecting beams from the annular light sources so that the beams are especially focused at peripheral portions of wafers.
Figure 11:
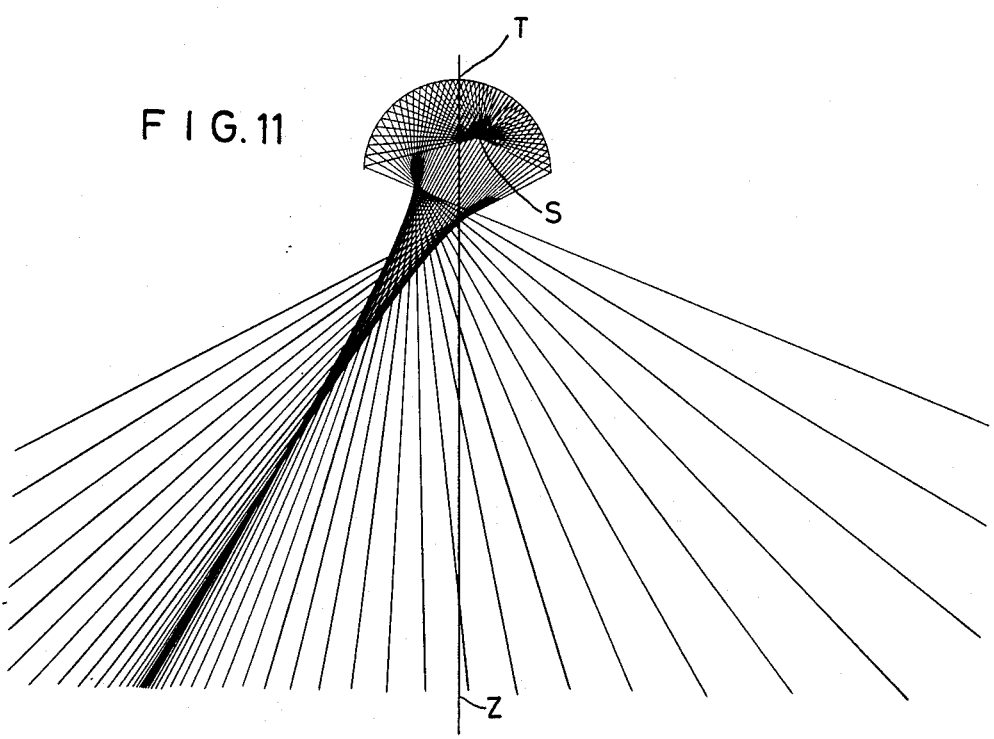
Figure 12:
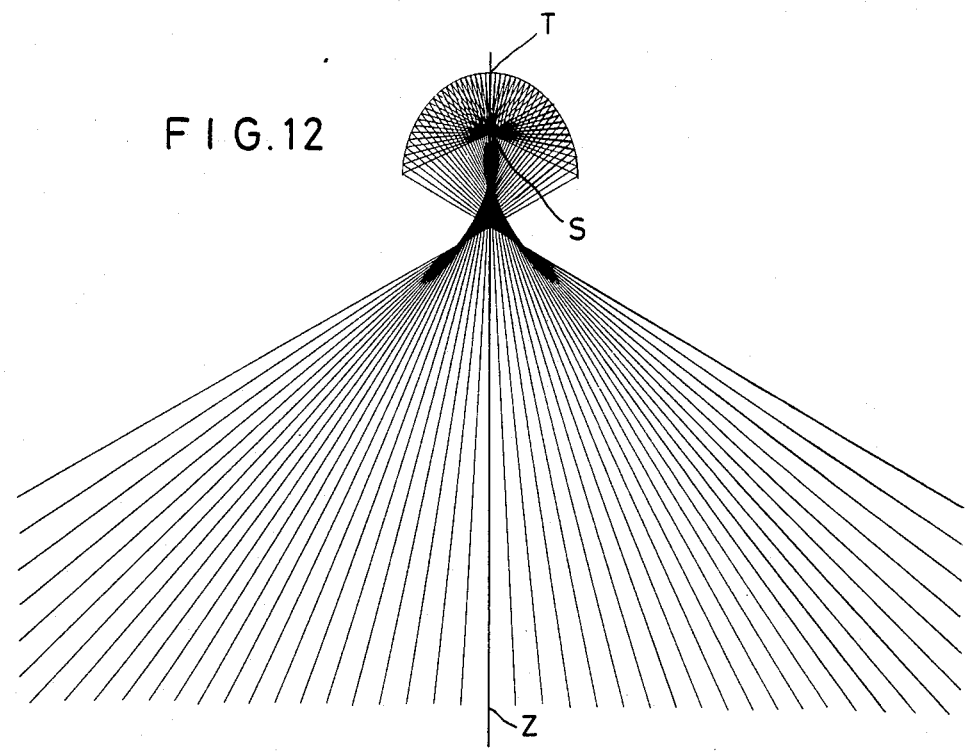
Figure 13:
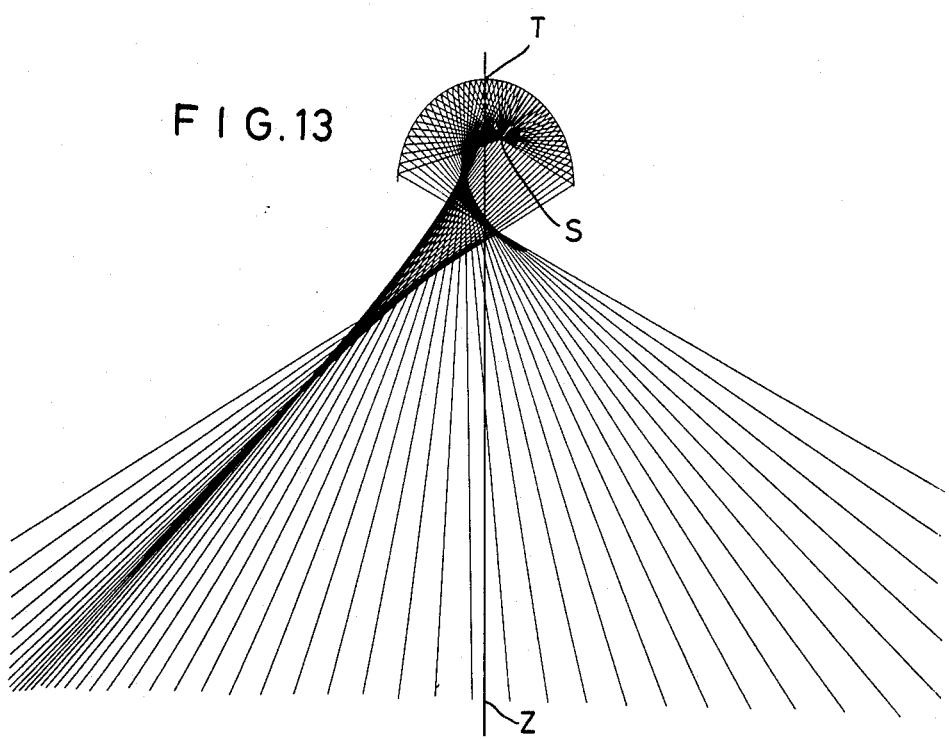

FIGS. 10 to 13 show sections each corresponding to a plane passing through the concentric center of the rotationally symmetrical annular light sources and the rotationally symmetrical annular mirrors. Since both the annular light sources and the annular mirrors are rotationally symmetrical, the actual states of beams can be estimated according to behavior of the beams on the section passing through the illustrated concentric center. Referring to FIGS. 10 to 13, the ordinate Z represents an optical axis, and T represents a vertex of the annular mirror. In the cases shown in FIGS. 10 to 13, the annular mirror is a concave mirror having a spherical section. FIG. 10 shows the case wherein an emission center S of the annular light source is located at a position on the axis Z of the annular mirror. FIG. 11 shows the case wherein the emission center S of the annular light source is deviated from the axis of the annular mirror. FIGS. 12 and 13 show cases wherein the section defined by the annular mirror is constituted by an elliptical concave mirror. More specifically, FIG. 12 shows the case wherein the emission center S of the annular light source is located at a position on the axis of the annular mirror, and FIG. 13 shows the case wherein the emission center S of the annular light source is deviated from the axis Z of the annular mirror.

Technical data of the cases in FIG. 10 to 13 are summarized below. The upper direction in the Z-axis in FIGS. 10 to 13 is positive, and the right direction of the Y-axis in FIGS. 10 to 13 is positive. The origin is defined as an intersection between the annular mirror and the optical axis.

TABLE 8

| | Radius of Curvature of Vertex | Surface Shape | Point (Z,Y) of Light Source (mm) |
|---|---|---|---|
| FIG. 10 | 13.0 mm | Spherical | (−8.0,0.0) |
| FIG. 11 | 13.0 mm | Spherical | (−8.0,3.0) |
| FIG. 12 | 10.0 mm | Elliptical K = 0.7 | (−8.0,0.0) |
| FIG. 13 | 10.0 mm | Elliptical K = 0.7 | (−8.0,2.0) |

(K is the conical constant on the elliptical surface.)

In each case, the light-emitting portion of the annular light source is regarded as a point light source. Beams are defined as beams perfectly diffused at equal angular intervals of 5° from the point light source in the section. The states of the beams are illustrated as light path views. When the light source S is located on the optical axis, a light source image is formed at a conjugate position separated from the vertex T by 34.7 mm in FIG. 10 and a light source image is formed at a conjugate, position separated from the vertex T by 13.3 mm in FIG. 12. The entire surface of the wafer can be substantially uniformly illuminated. If the light source S is deviated from the optical axis by 3 mm (FIG. 11) and 2 mm (FIG. 13), positions where most of the beams are condensed are deviated from the axis in a direction opposite to the deviation direction of the light source S. The optical axis coincides with a line connecting an arc of a reflecting surface cut by a plane including the axis N (i.e., a predetermined plane of the annular surface required for reflecting the beam) and the center of a circle or an ellipse for forming this arc.

Referring to FIGS. 11 and 13, when the emission point is deviated from the optical axis of the concave mirror, the beams can be concentrated in the peripheral portion deviated from the optical axis of the concave mirror. According to a comparison between FIGS. 10 and 12, the elliptical mirror having the conical constant K smaller than 1 is better than the spherical mirror in order to condense the beams on the axis. As described above, according to the present invention, the annular mirror is deviated as described above with respect to the outer annular light source, so that the focusing area is concentrated in the peripheral portion of the wafer. Therefore, an illuminance distribution is given to the peripheral portion of the wafer to prevent a temperature drop caused by heat dissipation. The entire surface of the wafer can be uniformly heated.

FIGS. 14 to 18 show optical paths when the four annular light sources 1a, 1b, 1c, and 1d are positioned on the basis of the technical data in Table 1 and a 6" (150 mm) wafer is irradiated by a light radiation apparatus having annular mirrors and annular light sources, both of which are equivalent to those shown in FIGS. 11 and 12 and technical data of which are given in Table 8.

Figure 14:
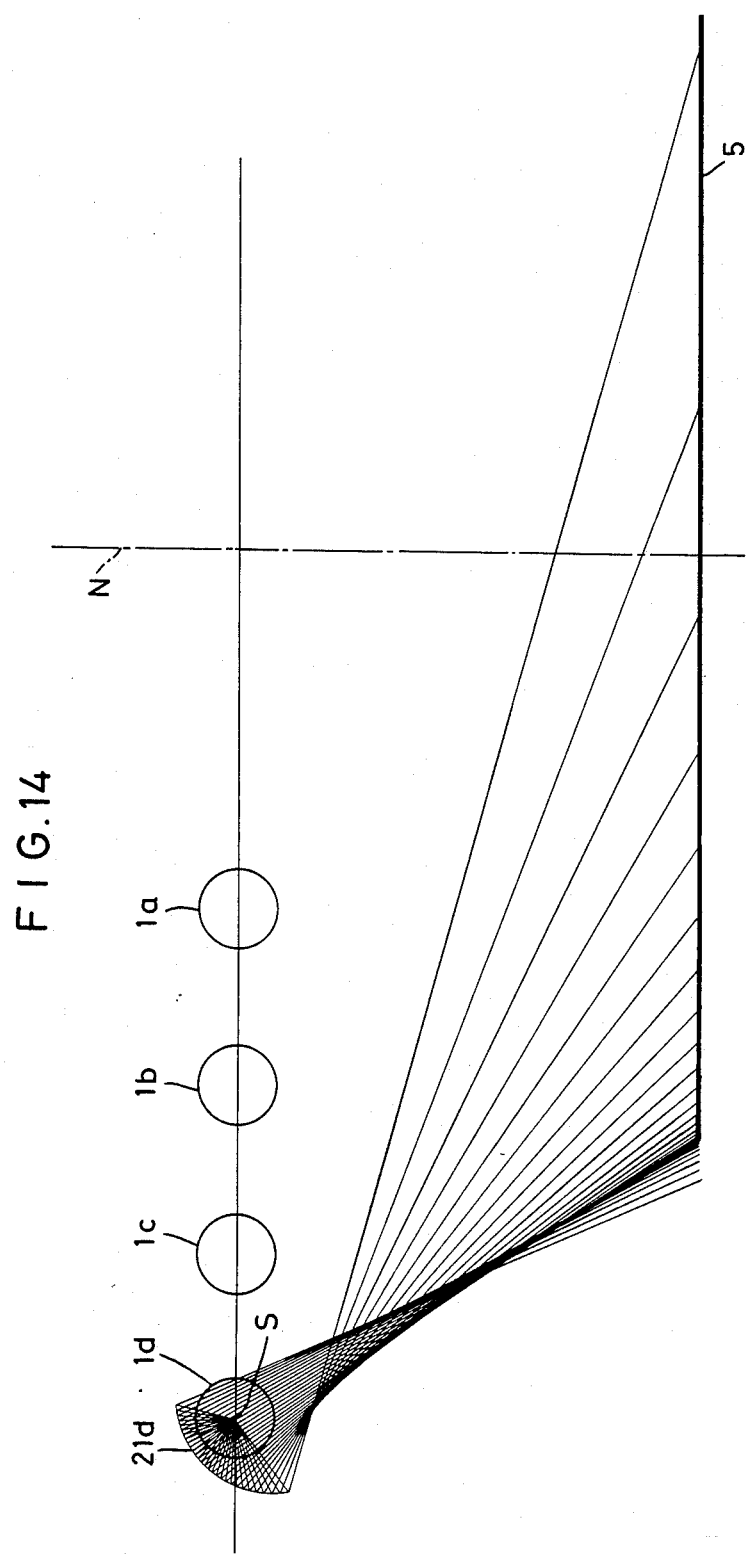
FIGS. 14 and 15 are views showing optical paths of beams emitted from outer annular light sources and reflected by annular mirrors each having a concave elliptical surface.

Referring to FIG. 14, an annular mirror having a section of a radius of curvature of 13 mm is arranged for the outermost annular light source 1d. The outer diameter of the annular light source 1d is about 10 mm, and a resistor wire as a light-emitting portion extends at the center of the section along the light-emitting portion. The center of the light-emitting portion is deviated by Y=3 mm from the optical axis Z of the section of the annular mirror. As shown in FIG. 14, the wafer is irradiated with beams having an illuminance distribution where the illuminance of the peripheral portion of the wafer is higher than that of the central portion thereof.

Figure 15:
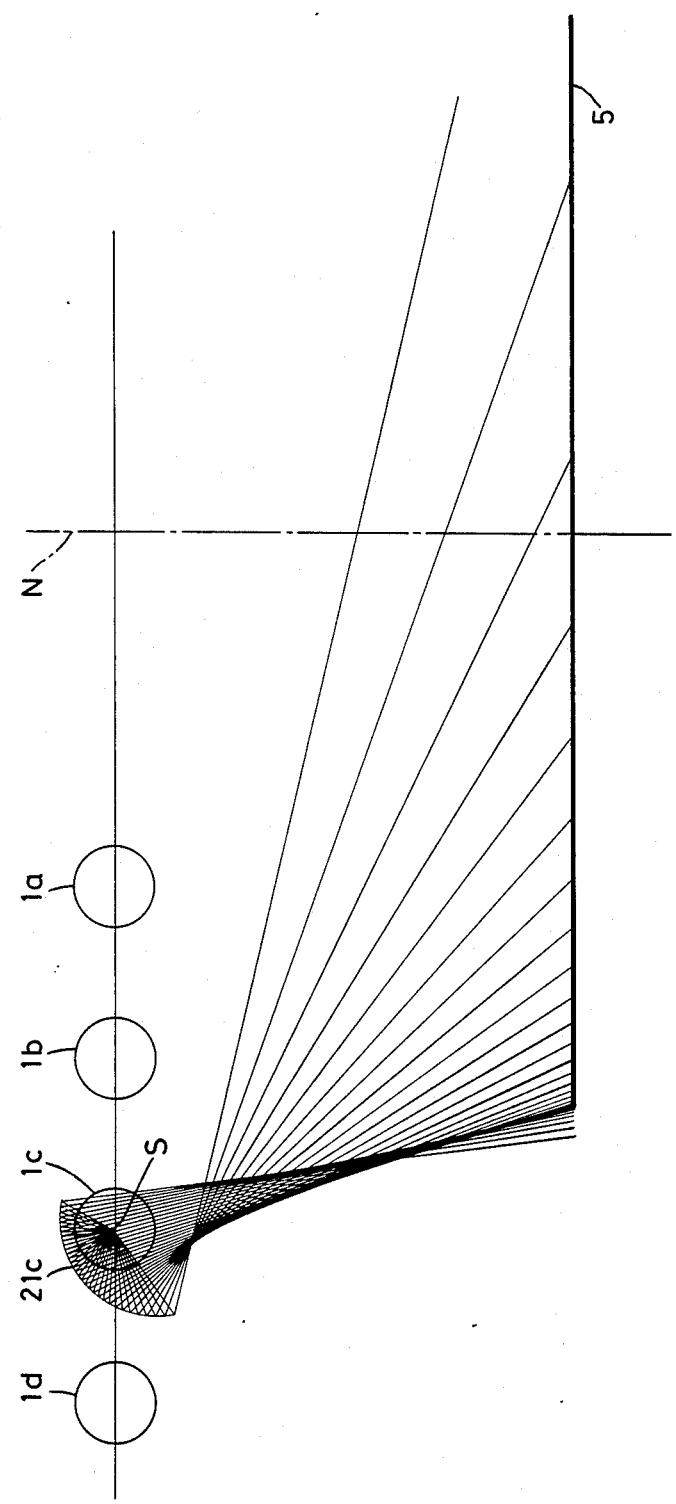

Referring to FIG. 15, the light-emitting portion of the inner light source 1c is deviated by Y=3 mm from the optical axis of an annular mirror having a section of the radius of curvature of 13 mm. A distribution is obtained such that an illuminance of the peripheral portion of the wafer is higher than that of the center.

When such annular mirrors are located behind the annular light sources 1d and 1c, a relatively larger radius of curvature must be selected to focus the beams on the peripheral portion of the wafer when the section is constituted by a spherical surface. The pitch of the annular light sources must be large in consideration of the interference conditions of beams between the adjacent annular light source and mirror. Therefore, the density of the surface light source formed by the plurality of annular light sources is decreased. In order to solve the above problem, the sectional shape of the outer annular mirror is not given by a spherical surface but advantageously an elliptical surface.

Figure 16:
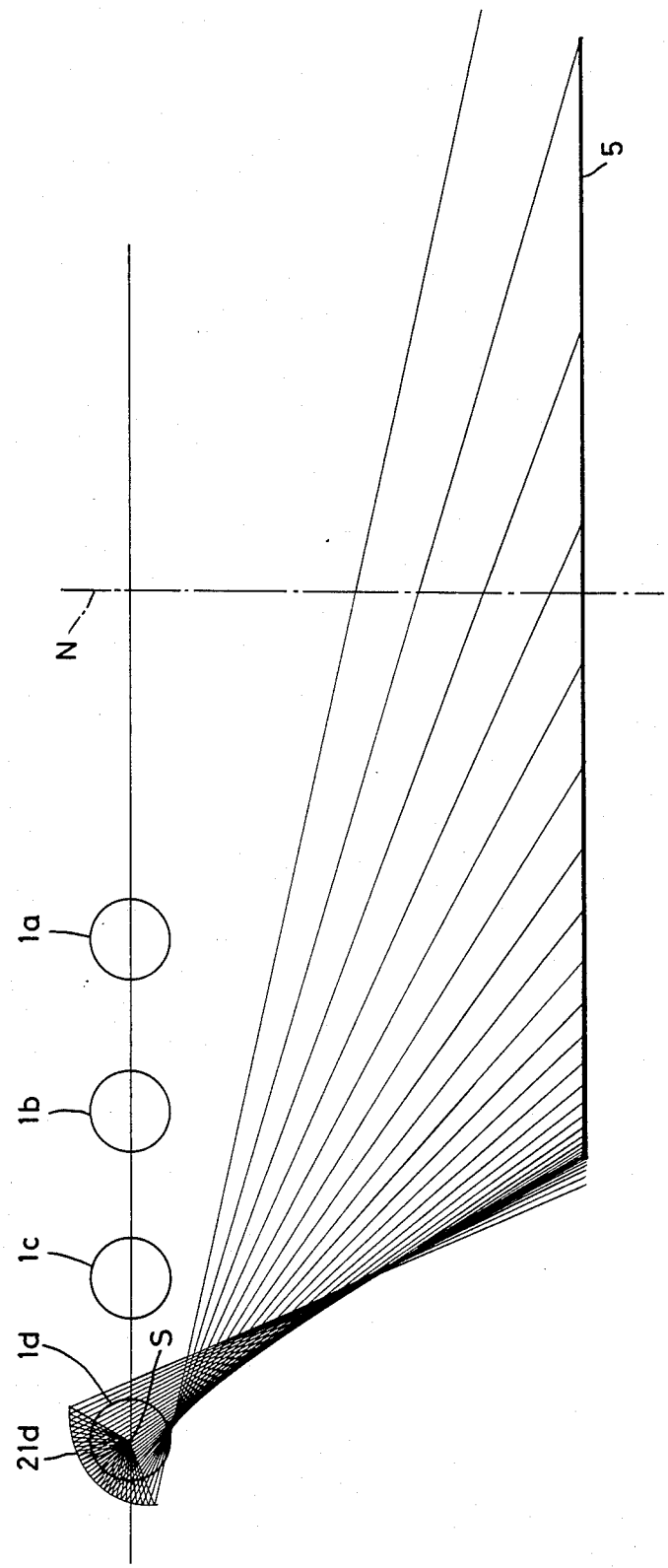
FIG. 16 and 17 are views showing optical paths of the beams obtained such that the beams from the outer annular light source are reflected by the annular mirrors.
Figure 17:
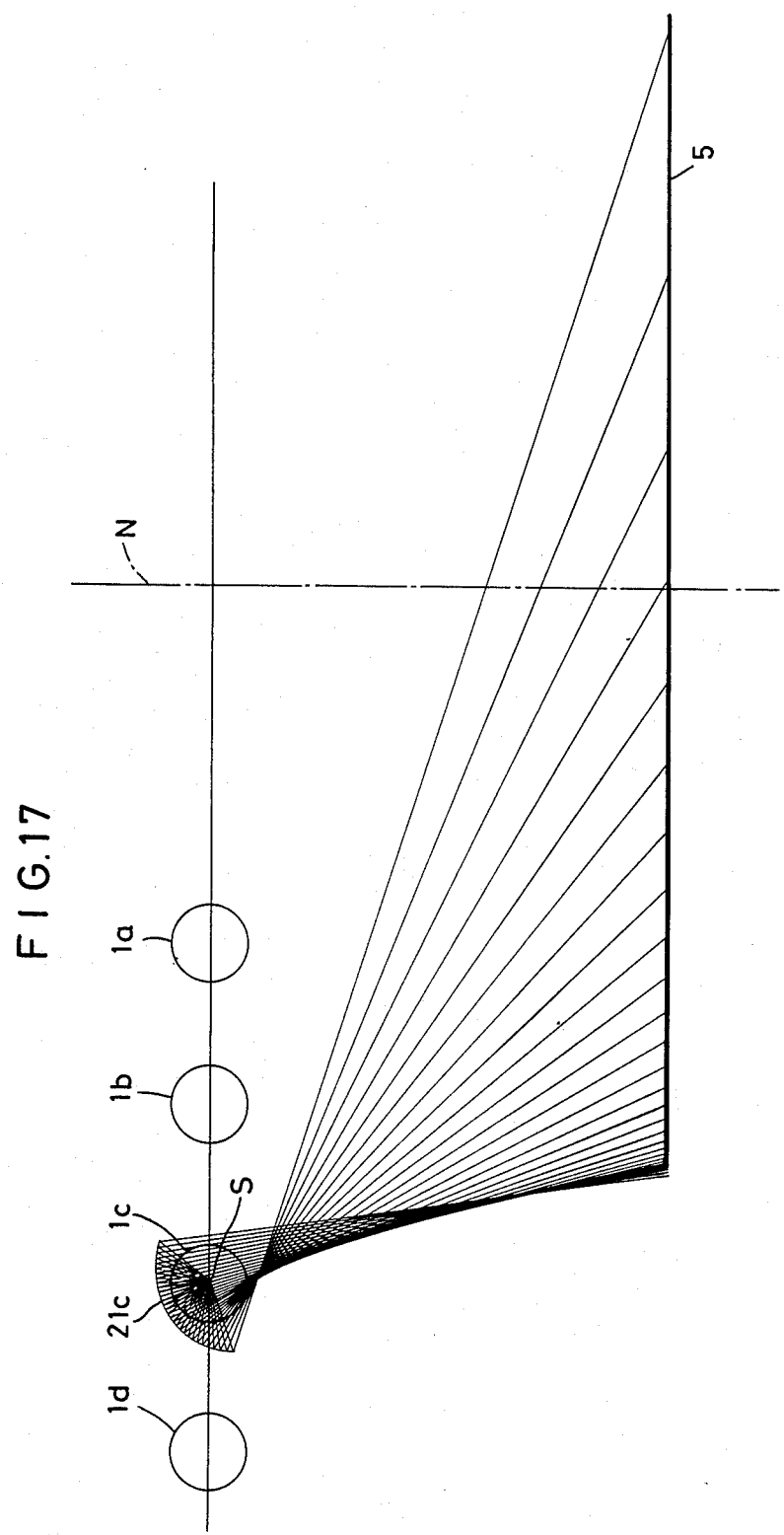

Referring to FIGS. 16 and 17, annular mirrors each having a radius of curvature of the vertex of the section 7 of 10 mm and an elliptical surface having a annular light sources 1c and 1d. FIG. 16 shows a state conical constant K=0.7 were used for the outer wherein beams emitted from the outermost annular light source 1d are reflected by the corresponding annular mirror. FIG. 17 shows a state wherein beams from the second annular light source 1c adjacent to the outermost annular light source are reflected by the corresponding mirror. Since the light-emitting portion S is deviated by Y=2 mm from the optical axis of the section of the annular mirror, a higher illuminance of the peripheral portion of the wafer is assured as compared with that of the central portion thereof.

Although the radius of curvature of the section of the annular mirror in FIGS. 14 and 15 is 13 mm, the radius of curvature of the vertex in FIGS. 16 and 17 can be reduced to 10 mm since the elliptical surface is employed. For this reason, the distance between the annular light sources can be decreased, and a high-density light source unit can be obtained. If the section is constituted by a spherical surface, manufacture can be simplified. It is difficult to form an elliptical surface. However, the light source density can be advantageously increased.

Figure 18:
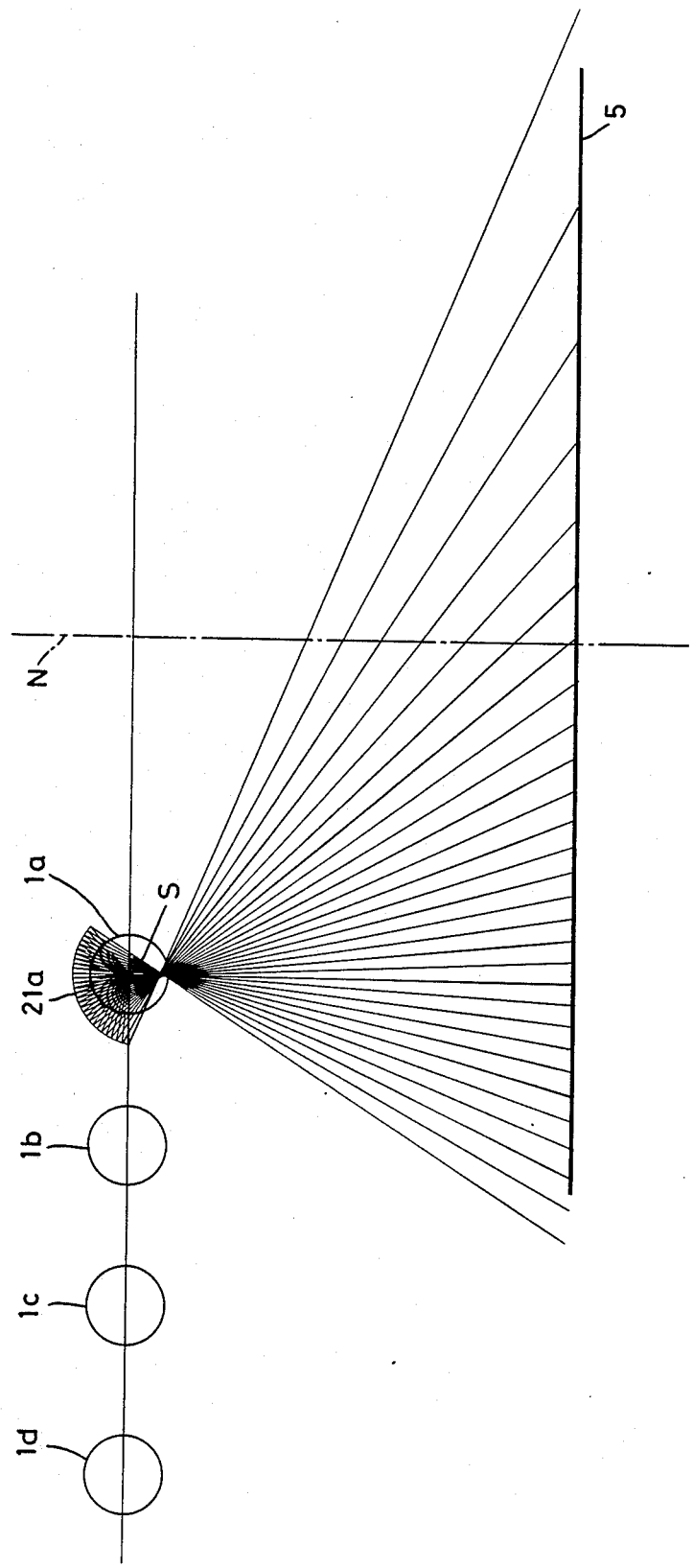
FIG. 18 is a view showing an optical path of beams emitted from inner annular light sources and reflected by annular mirrors each having a concave elliptical surface.

Of the plurality of concentrically arranged annular light sources, the outer annular light source is designed such that the illuminance of the peripheral portion of the wafer is abruptly increased by means of the annular mirror, as shown in FIGS. 14 to 17. However, the inner annular light source is designed such that the illuminance of the entire surface of the wafer is set uniform, as shown in FIG. 18. Referring to FIG. 18, an annular mirror having a concave spherical mirror having the a of curvature of 10 mm is arranged for the innermost annular light source 1a such that the light-emitting portion S of the annular light source 1a is located on the optical axis. In FIGS. 14 to 18, only the left portions of the annular light sources are illustrated. If the behavior of the right portion is included for a space having a normal N as the concentric center rotationally symmetrical axis, the center of the wafer has rather a high illuminance. Referring to FIGS. 14 to 18, an area cut by a plane including the axis N of the annular mirror surface on which the beam from the light source is reflected is determined by a distance between the light source and the wafer along the axis N, the position in a direction perpendicular to the axis N of the light source, and the light source position with respect to the mirror surface.

According to this embodiment as described above, if loads applied to the plurality of annular light sources are set identical, operations are performed as follows:

(1) The entire surface of the wafer is substantially uniformly irradiated with beams directly emitted from the four concentrically arranged annular light sources 1a, 1b, 1c, and 1d to the wafer.

(2) The entire surface of the wafer is substantially uniformly irradiated with beams emitted from the inner annular light sources 1a and 1b and reflected by the annular mirrors 21a and 21b.

(3) The peripheral portion of the wafer is particularly irradiated with the beams emitted from the outer annular light sources 1c and 1d and reflected by the annular mirrors 21c and 21d such that an illuminance distribution of the peripheral portion of the wafer is abruptly increased. In particular, preferable annular light sources are ones each having a diameter larger than the outer diameter of the wafer, thereby increasing the illuminance of the peripheral portion of the wafer.

With the above arrangement, the wafer can be uniformly kept at a predetermined temperature with high precision. Heating can be thus performed while the uniform state is kept unchanged. If a decrease in temperature of the peripheral portion of the wafer occurs, the power supplied to the outer ones of the plurality of concentrically arranged annular light sources is relatively increased. The temperature of the peripheral portion is increased to restore a uniform temperature distribution.

Since beams which are not reflected by the annular mirrors and do not directly reach the wafer, as well as beams reflected by the wafer surface, are reflected by the chamber or its outer walls and are incident on the wafer surface, it is preferable to set the uniform temperature distribution of the wafer surface in consideration of these beams in addition to the regularly incident beams.

Figure 19:
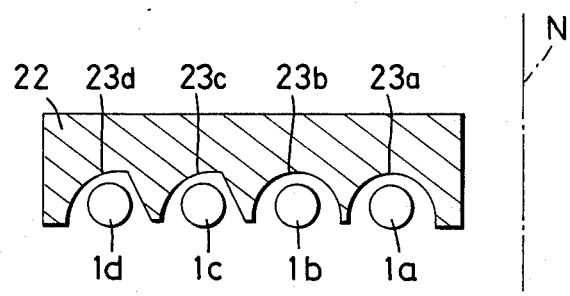
FIGS. 19 and 20 are sectional views showing reflecting means obtained by integrally arranging the annular mirrors.

The above-described annular mirrors are substantially concentrically arranged to constitute a reflecting member for effectively directing the beams from the concentrically arranged annular light sources on the wafer surface. In this case, a plurality of annular mirrors are combined to constitute a single reflecting member. The section of a reflecting member 22 having such an arrangement is shown in FIG. 19. The reflecting member 22 includes a substrate (e.g., copper or aluminum) having a high heat conductivity. Gold plating is performed on the reflecting surface opposite to the chamber to increase the reflectance of the heating beams. In order to prevent over-heating of the reflecting member upon reception of beams from the annular light sources, a cooling means (not shown) using cooling air, cooling water, or the like is preferably used. As shown in FIG. 19, for inner annular light sources 1a and 1b, the sectional shape of the annular mirrors 23a and 23b are constituted by spherical surfaces while the light-emitting portions are located on the optical axis. For the outer annular light sources 1c and 1d, the outer reflecting surfaces of the outer annular mirrors 21c and 21d having a spherical surface or an aspherical surface (e.g., an elliptical surface) are concave surfaces while the light-emitting portions are deviated from the light axis of the annular mirrors 23c and 23. As indicated by the inner straight line, a conical surface is formed in practice to guide beams from the light source to a portion outside the wafer.

Figure 20:
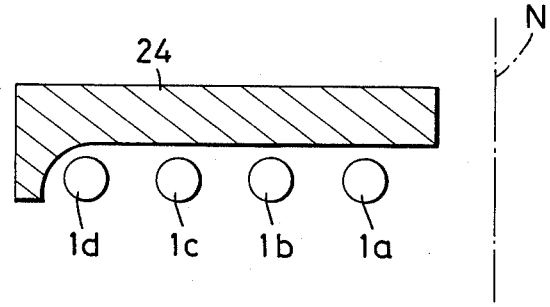

Heat dissipation of the wafer varies depending on a gas atmosphere and a chamber shape. If heat is not greatly dissipated from the peripheral portion of the wafer, a reflecting member 24 shown in FIG. 20 may be used since beams need not be particularly concentrated on the peripheral portion of the wafer. The reflecting member 24 allows formation of an annular mirror for only the outermost annular light source 1d. A common plane mirror is formed for other annular light sources. In this case, in order to set a high intensity of the beam emitted from the outermost annular light source 1d and reflected by the reflecting member 24, the emission light source S is deviated inward from the optical axis Z of the concave spherical surface of the section by a predetermined amount.

A control system for emission of the annular light sources according to the present invention will be described with reference to FIG. 21.

An output from the detector 11 serving as a radiation thermometer is input to a microcomputer 41. Lamp control units 42a, 42b, and 42c comprising thyristors are connected to the outputs of the microcomputer 41. Each unit receives a control signal from the microcomputer 41. The lamp control units 42a, 42b, and 42c supply powers corresponding to the control signals to the lamps. The pair of upper and lower annular light source sets opposite to each other and having identical radii are turned on/off by the corresponding lamp control units. More specifically, the control unit 42a controls the annular light source 1a and the corresponding light source, the control unit 42b controls the annular light source 1b and the corresponding light source, and the control unit 42c controls the annular light source 1c and the corresponding light source. The light sources controlled by each control unit are connected in parallel to each other.

The operation of this embodiment will be described with reference to the flow chart of FIG. 22.

In step S1, signals are supplied from the microcomputer 41 to lamp control units 42a to 42c, corresponding powers are respectively supplied to the annular light sources, and the flow advances to step S2. In step S2, the scanning mirror 9 is driven to scan the entire area of the substrate 5. Outputs from the detector 11 are sampled at predetermined intervals. The temperatures at a plurality of sampling positions are measured to calculate the temperature profile of the substrate. The temperature measurement positions are determined by a data input means (not shown) in accordance with the diameter of the semiconductor substrate to be treated. Control results of infrared lamps for obtaining a uniform one of various temperature profiles of the substrate at measurement positions are theoretically or experimentally obtained in advance. A map representing the relationship between the temperature profiles and ON control of the infrared lamps is stored in a ROM incorporated in the microcomputer 41. In step S3, the microcomputer 41 causes a timer incorporated therein to measure a predetermined annealing time, and the microcomputer 41 determines whether annealing is completed. If YES in step S3, power supply to the annular light sources is interrupted in step S4, and the flow is ended. However, if NO in step S3 powers supplied to the annular light sources are controlled on the basis of the map in step S5.

The flow then returns to step S2, and the above operation is repeated. The temperature measurement by the radiation thermometer is performed in accordance with the known Planck's law of radiation.

Japanese Patent Appln. Laid-Open No. 198735/1986 describes a control system wherein a plurality of temperature sensors are arranged above a wafer and powers to be supplied to the annular light sources are controlled in response to outputs from the temperature sensors. However, in order to prevent interference with wafer replacement, the plurality of temperature sensors must be moved every time the wafer is replaced with another For this purpose, a means for moving the plurality of temperature sensors in the chamber is required. In practice, on a factory production line or the like, a large number of wafers must be treated within a short period of time. The moving speed and precision of the moving means for the temperature sensors are important factors for determining efficiency. In addition, in order to precisely detect the temperature, the temperature sensors must be brought into contact with the wafer. The uniform temperature profile cannot be maintained by this contact, resulting in inconvenience.

As described above, it is possible to uniformly radiate the entire surface of the wafer by the plurality of concentrically arranged annular light sources. This uniformity is based on an assumption wherein a given light emission amount per unit length of each annular light source is determined. However, the lengths of the light-emitting portions of the annular light sources differ from each other. In order to obtain a given emission amount per unit length, the lengths of the light sources and the powers supplied in correspondence with the resistances of the light sources must be controlled, and therefore, a complicated control system is required.

Figure 23:
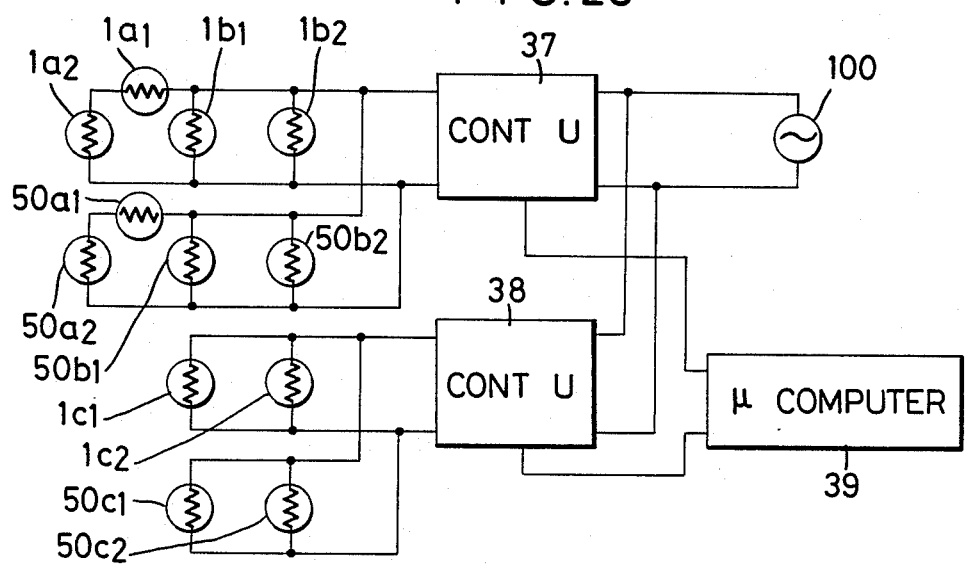
FIG. 23 is a block diagram of a control network for the annular light sources.

FIG. 23 is a circuit diagram showing an arrangement slightly different from the arrangement of FIG. 21 to control the emission amount of the annular light sources. Of the six semicircular light sources 1a1, 1a2, 1b1, 1b2, 1c1, and 1c2 (FIG. 6) arranged above the chamber 2, the two semicircular light sources 1a1 and 1a2 constituting the innermost or first annular light source are connected in series with each other. The series-connected two semicircular light sources are connected in parallel with two semicircular light sources 1b1 and 1b2 constituting the second annular light source. These light sources are simultaneously controlled by a control unit 37. Of the six semicircular light sources 50a1, 50a2, 50b1, 50b2, 50c1, and 50c2 located below the chamber 4, the two semicircular light sources 50a1 and 50a2 constituting the innermost or first annular light source are connected in series with each other. These series-connected light sources are connected in parallel with the semicircular light sources 50b1 and 50b2 constituting the second annular light source. These light sources are simultaneously controlled by a control unit 37. The semicircular light sources 1c1 and 1c2 and the semicircular light sources 50c1, and 50c2, both pairs of which constitute the outermost or third annular light sources, are connected in parallel with each other and are simultaneously controlled by a control unit 38.

The rated voltage for the semicircular light sources 1a1, 1a2, 50a1, and 50a2 constituting the innermost or first annular light sources is 100 V, and the rated voltage for semicircular light sources constituting the second and third annular light sources is 200 V. Since pairs of innermost annular light sources are connected in series with each other, a composite rated voltage can be 200 V. In this manner, the innermost annular light sources can be operated at the same rated voltage as in the semicircular light sources constituting the second annular light sources. For this reason, the semicircular light sources 1a1, 1a2, 1b1, and 1b2 and the semicircular light sources 50a1, 50a2, 50b1, and 50b2 which constitute the first and second annular light sources having different rated voltages can be simultaneously controlled.

The control units 37 and 38 are controlled by the microcomputer 39. The microcomputer 39 controls the control units 37 and 38 in the same manner as the microcomputer 41 of FIG. 21 to obtain a desired temperature profile of the entire surface of the wafer, thereby adjusting emission amounts of the first and second annular light sources and the emission amount of the third annular light source. In the control units 37 and 38, power supplied from an AC power supply 100 is controlled such that phase controllers using thyristors control the input power to have power levels suitable for the respective light sources. The microcomputer 39 generates signals for defining the phase control amounts of the thyristors in the control units. In the arrangement of FIG. 23, the annular light sources 1d1 and 1d2 shown in FIG. 6 are omitted.

In the light radiation apparatus described above, the temperature or power profile is input from an input means (not shown) to the microcomputer 39, and the apparatus is controlled to realize the input profile. In the above arrangement, only the semicircular light sources constituting the outermost annular light sources are controlled independently of other annular light sources because independent control is to be performed such that the emission power from the outermost lamps is increased to prevent nonuniformity of the temperature profile caused by heat dissipation from the peripheral portion of the wafer. The emission amount per unit length of each of the outer semicircular light sources 1c1, 1c2, 50c1, and 50c2 is set higher than that of each of the inner semicircular light sources when a given voltage is applied thereto. In this case, all semicircular light sources can be simultaneously controlled by a single power control unit.

Figure 24:
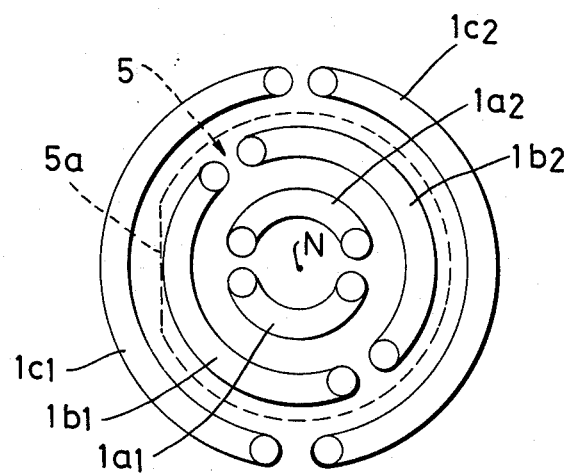
FIG. 24 is a plan view showing an annular light source disposition corresponding to the shape of the wafer.
Figure 25:
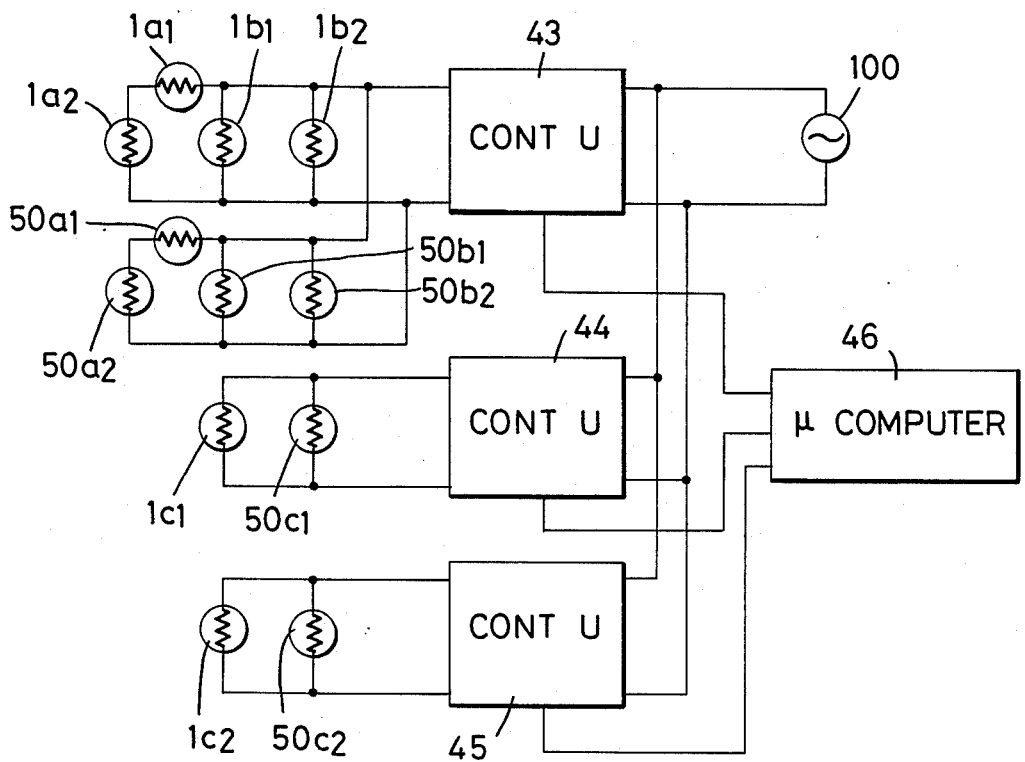
FIG. 25 is a block diagram of a control network for the annular light sources.

FIG. 24 shows an arrangement of arcuate light sources 1c1 and 1c2 in consideration of the wafer shape, and FIG. 25 is a circuit diagram for driving the light sources in FIG. 24.

Referring to FIG. 25, two light sources 1a1 and 1a2 and two light sources 50a1 and 50a2, both pairs of which respectively constitute innermost or first annular light sources, are connected in series with each other. Light sources 1b1 and 1b2 and light sources 50b1 and 50b2, both pairs of which respectively constitute the second annular light sources, are connected in parallel with each other. These power sources are controlled by a control unit 43. A composite voltage for the light sources 1a1 and 1a2 and the light sources 50a1 and 50a2 is the same as the rated voltage for the light sources 1b1 and 1b2 and 50b1 and 50b2 since the innermost light sources 1a1 and 1a2 and 50a1 and 50a2 are connected in series with each other. The semicircular light sources constituting the innermost or first annular light source can be controlled with the same rated voltage as that of the semicircular light sources constituting the second annular light source, thereby obtaining a uniform illuminance distribution.

Non-light-emitting portions including the electrodes of four light sources 1c1, 1c2, 50c1, and 50c2 constituting the outermost or third annular light source located above and below the major surfaces of the wafer 5 are angularly shifted by 90° about the concentric center N from the direction of an orientation flat (to be referred to as an O.F. hereinafter) of the wafer 5 indicated by the broken like in FIG. 24. The light source 1c1 located above the upper surface of the O.F. of the wafer 5 is connected in parallel with the light source 50c1 located below the lower surface of the O.F. thereof. These light sources are simultaneously controlled by a control unit 44. The upper and lower light sources 1c2 and 50c2 located on the side opposite to the O.F. of the wafer 5 are also connected in parallel with each other and are simultaneously controlled by a control unit 45. The control units 43 to 45 are controlled by a microcomputer 46.

The arrangements of the control units 43 to 45 are basically the same as those of the control units 37 and 38 of FIG. 23. The outermost annular light source is controlled independently of the inner annular light source, thereby correcting temperature profile nonuniformity caused by heat dissipation from the peripheral portion of the wafer. In addition, the light sources on the O.F. side can be controlled separately from those on the side opposite to the O.F. side. Therefore, temperature profile nonuniformity caused by dimensional asymmetry of the O.F. can also be corrected.

Figure 26:
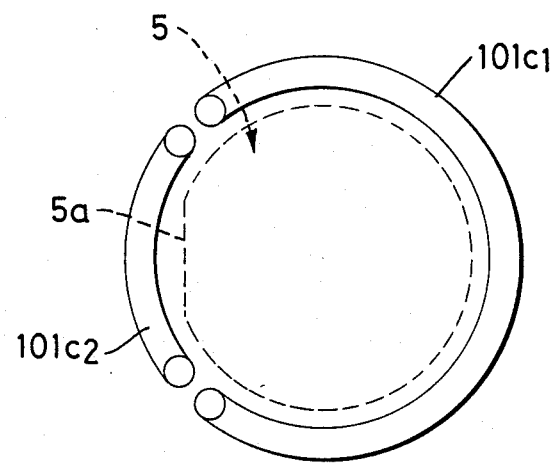
FIGS. 26, 27, and 28 are respectively plan views showing improved light source arrangements each including a plurality of concentrically arranged annular light sources and prepared in consideration of the wafer shape.

The arrangement of the outermost annular light sources is not limited to the one shown in FIG. 24 but may be replaced with another arrangement. An improved arrangement of the annular light source is referred to below. First and second annular light sources in FIG. 26 are the same as those of FIG. 24, and a detailed description thereof will be omitted. As shown in the plan view of FIG. 26, an outer third annular light source 101c2 is located at a portion corresponding to angular range of the O.F. 5a of the wafer about the concentric center. One light source 101c1 is located in the remaining angular range. These two arcuate light sources constitute the third annular light source.

Figure 27:
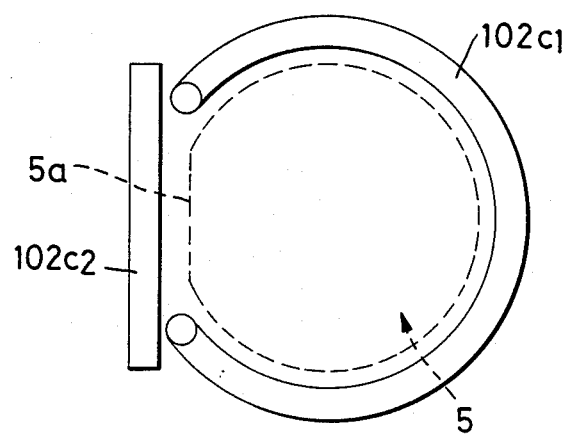
Figure 28:
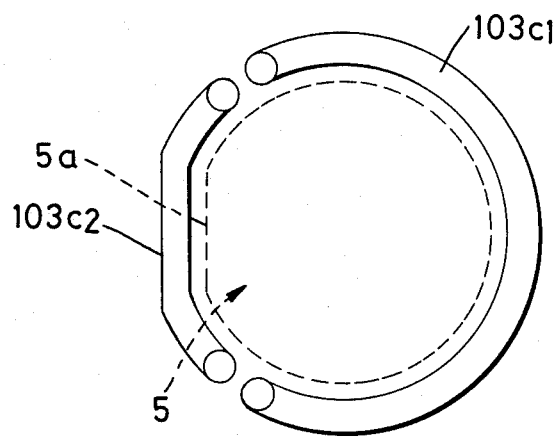

In FIG. 27a source 102c2 and a light source paired therewith are located in the radial area corresponding to the O.F. 5a of the wafer so as to sandwich the wafer. An arcuate light source 102c1 and a light source paired therewith are located in the area excluding the O.F. 5a so as to, sandwich the wafer. Other arrangements in FIG. 27 are the same as those in FIG. 26. Referring to FIG. 28, a light source 103c2 and a light source paired therewith, intermediate portions of which are linear and both ends of which are arcuate are located in one radial area corresponding to the O.F. 5a of the wafer 5 so as to obtain a shape similar to the outer shape of the wafer. The light source 103c2 and the corresponding light source are located above and below the wafer. An arcuate light source 103c1 and a light source paired therewith are located in the other radial area. In either arrangement, as shown in FIG. 25, the innermost semicircular light sources are connected in series with each other and can be simultaneously controlled together with other light sources, thereby obtaining a uniform illuminance distribution.

Figure 29:
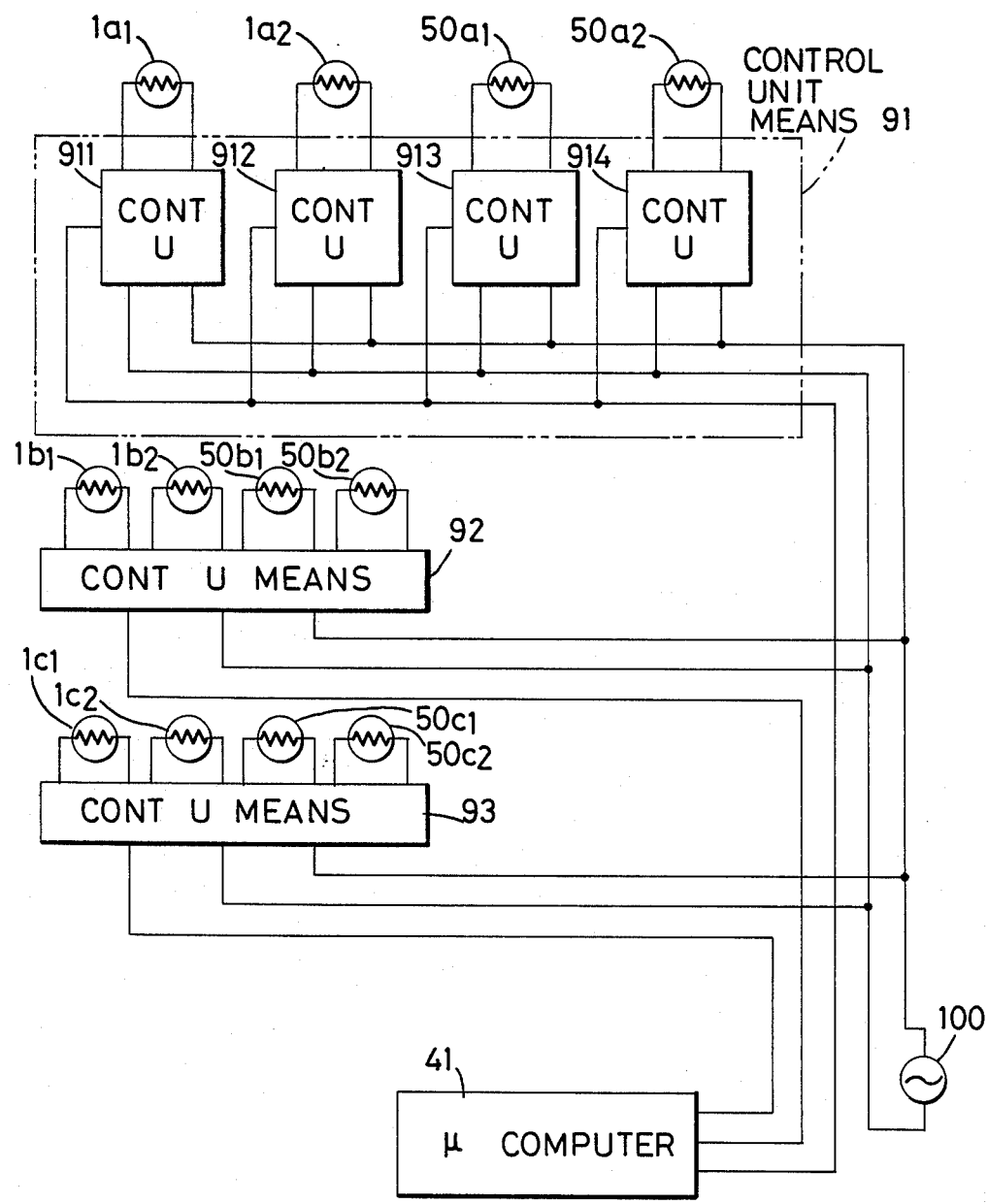
FIG. 29 is a block diagram showing an improved arrangement of control units for annular light sources.

A reflecting mirror may be located near each light source at a position opposite to the wafer to improve radiation efficiency. However, in this case, the shape of the reflecting mirror for the outer annular light source may be deformed for the O.F. so as to correct temperature profile nonuniformity, thereby preventing a slip line at the O.F. The slip line is defined as a scratch formed on the wafer. FIG. 29 shows an improved arrangement of the control units. Each control unit in FIG. 29 is connected to one light source. Emission amounts of the arcuate light sources 1a1, 1a2, 50a1, and 50a2 are controlled by control units 911 to 914. The control units 911 to 914 constitute a control unit means 91. The pairs of upper and lower arcuate light sources 1b1 and 50b1 and 1b2 and 50b2 are connected with a control unit means 92, thereby controlling the emission amounts thereof. The pairs of upper and lower arcuate light sources 1c1 and 50c1 and 1c2 and 50c2 constituting the outer third annular light sources are connected to a control unit means 93. The control unit means 92 and 93 have the same arrangement as that of the control unit means 91.

The emission amount of each arcuate light source is controlled in accordance with a signal from the microcomputer 41.

Figure 30:
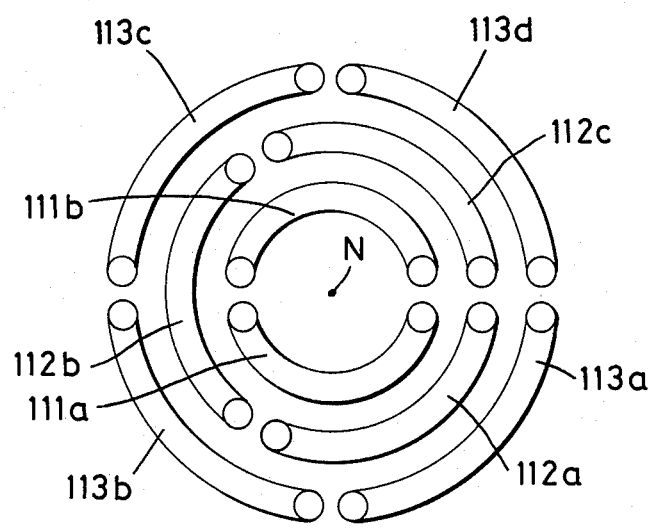
FIG. 30 is a plan view showing the improved arrangement of the annular light sources shown in FIG. 21.

Even if identical optical sources are used, emission amounts per unit may differ from each other at a given power due to fabrication conditions. In this case, in the arrangement shown in FIG. 29, a reference semicircular light source for semicircular light sources having identical radii of curvature and constituting a given annular light source is determined. A coefficient is multiplied with a control signal for the reference semicircular light source such that the emission power per unit length of other semicircular light sources having identical radii of curvature is set equal to that of the reference semicircular light source. Under this condition, the emission amount per unit length of semicircular light sources constituting one annular light source can be kept constant Therefore, the wafer can be uniformly heated while the rotationally symmetrical emission states can be maintained in accordance with control signals X, Y, and Z supplied from a main control unit means 91 to the annular light sources FIG. 30 shows an arrangement obtained by partially changing the arrangement of the annular light source shown in FIG. 21. As shown in FIG. 30, the innermost annular light source comprises two arcuate light source 111a and 111b. The second annular light source comprises three arcuate light sources 112a, 112b, and 112c each having a length corresponding to 120° with respect to the concentric center. The outermost or third annular light source comprises four arcuate light sources 113a, 113b, 113c, and 113d each having a length corresponding to 90° with respect to the concentric center.

A control system for the annular light sources shown in FIG. 30 is basically the same as that shown in FIG. 21. A control unit 42a controls the light sources 111a and 111b and light sources paired therewith. A control unit 42b controls the light sources 112a to 112c and light sources paired therewith. A control unit 42c controls the light sources 113a to 113d and light sources paired therewith.

The upper and lower annular light sources having identical radii of curvature and concentrically arranged above and below the wafer are preferably arranged such that the non-light-emitting portions thereof are not aligned in the radial direction with respect to the concentric center N.

Figure 31:
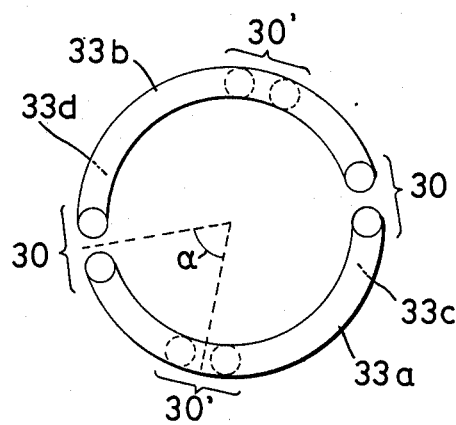
FIG. 31 is a plan view showing the disposition of a plurality of annular light source pairs.

More specifically, as shown in the plan view of FIG. 31, non-light-emitting portions 30 of arcuate light sources 33a and 33b constituting the upper annular light source are offset by an angle α from non-light-emitting portions 30' (indicated by the broken circles) of arcuate light sources 33c and 33d constituting the lower annular light source. The angle α is preferably about ½ the smaller one of the angle differences of the non-light-emitting portions shown in FIG. 6.

An annular light source may be arranged in a polygonal shape by combining a plurality of rod-like light sources. More specifically, a plurality of linear light sources are arranged to circumscribe a circle having a predetermined radius from a normal N at the central position of the wafer. The linear light sources constituting one annular light source are connected in parallel with each other.

Figure 32:
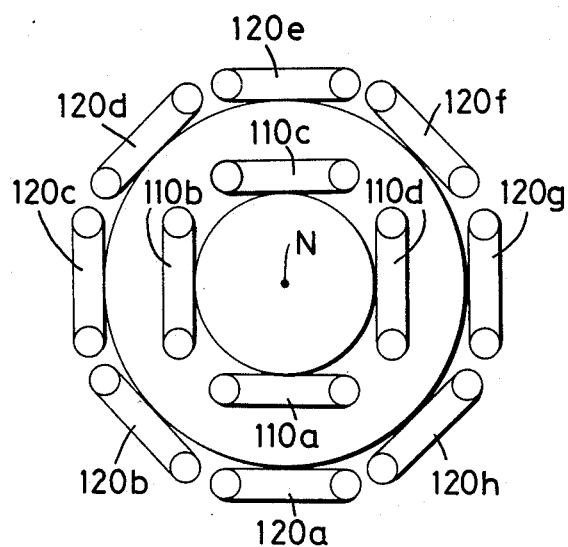
FIG. 32 is a plan view of annular light sources by using U-shaped light sources each having a linear light-emitting portion.

As shown in the plan view of FIG. 32, an inner annular light source comprises four linear light sources 110a, 110b, 110c, and 110d in a square shape, and eight linear light sources 120a, 120b, 120c, 120d, 120e, 120f, 120g, and 120h are arranged in an octagonal shape to constitute an outer annular light source. In this arrangement, rod-like light sources are identical, and therefore, only one type of light source can be used to constitute the annular light sources.

Figure 33:
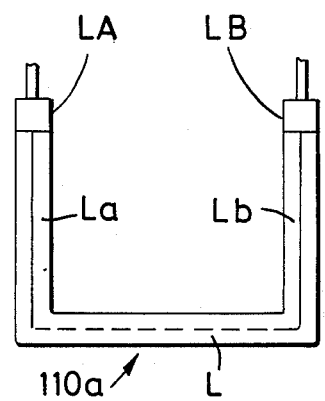
FIG. 33 is a side view showing the U-shaped light source.

The linear rod-like light source is defined as a light source having a linear light-emitting portion. As shown in the side view of FIG. 33, electrodes LA and LB are preferably formed at end portions of portions La and Lb extending vertically from a linear light-emitting portion L. Since the electrodes are formed in a direction perpendicular to the light-emitting portion, a total length of non-light-emitting portions of the linear light sources constituting one annular light source can be minimized to close to an ideal annular light source.

Figure 34:
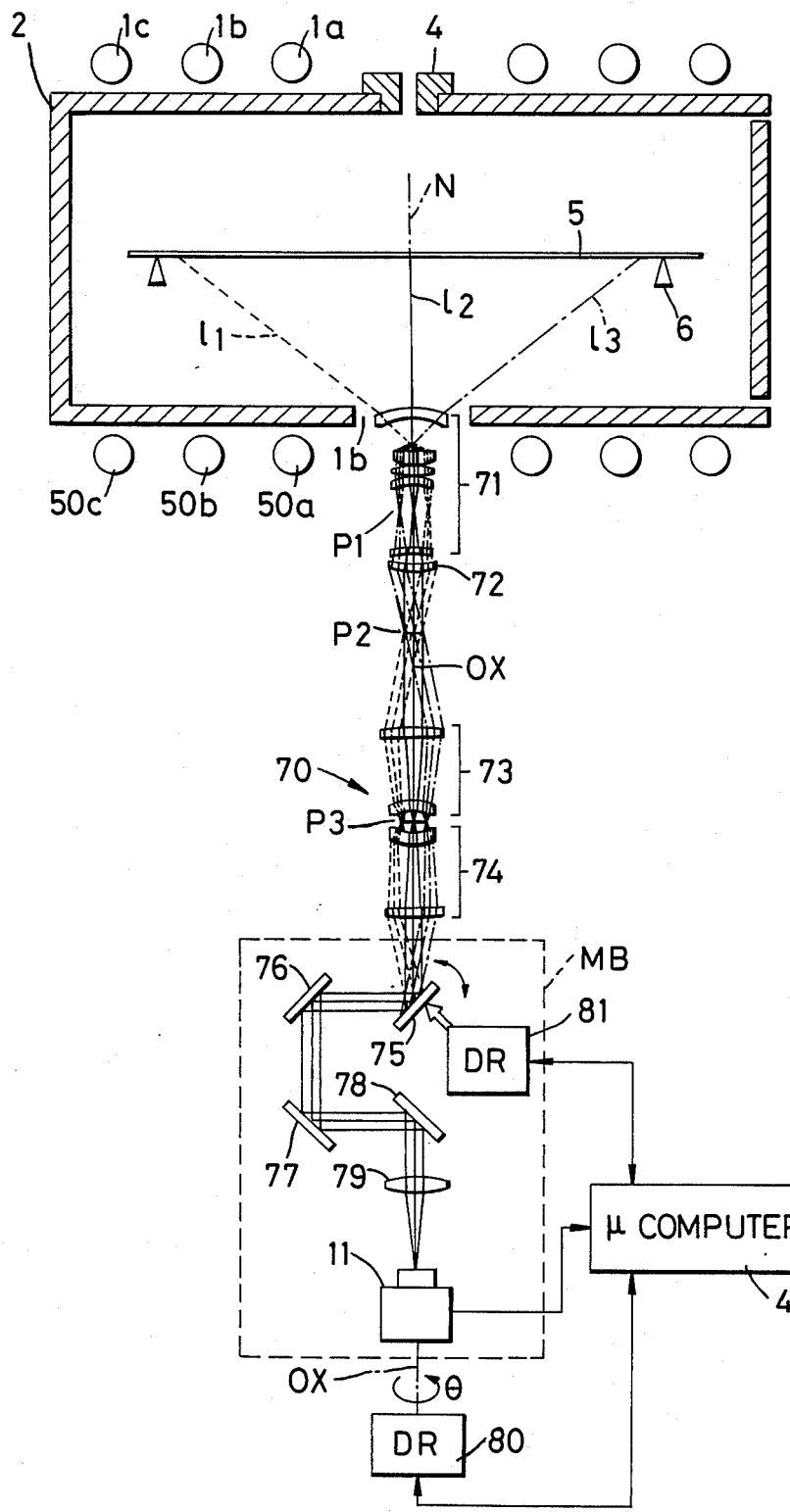
FIG. 34 is a schematic view showing an improvement of a temperature measuring system according to the present invention.

FIG. 34 shows an improved arrangement of the temperature measuring system shown in FIG. 1.

A focusing system 70 as an optical system in the temperature measuring system shown in FIG. 34 comprises two objective lenses 71 and 72, two relay lenses 73 and 74, a one-dimensional galvano scanner 75, three reflecting mirrors 76 to 78, and a condenser lens 79. An object point on a semiconductor substrate 5 is focused on a detector 11. An optical axis OX of the focusing system 70 is aligned with the normal N at the central position of the semiconductor substrate 5. The galvano scanner 75 serving as the one-dimensional scanning means, a driver 81 for driving the galvano scanner 75, the three reflecting mirrors 76 to 78, and the detector 11 constitute a rotatable mirror block MB driven by a driver 80 having, e.g., a stepping motor. Polar coordinate scanning can be performed by one-dimensional scanning of the galvano scanner 75 and rotation of the mirror block MB. The drivers 80 and 81 respectively comprise encoders. A microcomputer 41 instructs the drivers 80 and 81 on the basis of outputs from the encoders and detects a temperature profile on the basis of outputs from the detector 11.

A light beam from the semiconductor substrate 5 is focused at an intermediate image formation point P1 by the first objective lens 71. A pupil plane is formed at a point P2 by the second objective lens 72. An object conjugate plane is formed at a point P3 by the first relay lens 73. The beam from the first relay lens 73 is scanned by the galvano scanner 75 through the second relay lens 74, thereby forming a pupil plane of the focusing system at a position where the galvano scanner 75 is located. Therefore, parallel beams reflected by the mirror surface of the galvano scanner 75 are focused by the condenser lens 79 through the mirrors 76 to 78, thereby forming an image on the detector 11 located at the object conjugate plane. When the galvano scanner 75 is vibrated, the beam indicated by a left end broken line 11 reaches the detector 11 and the temperature is measured, as shown in FIG. 34. Thereafter, temperatures in the area (indicated by a solid line 12) from the left end to the center of the semiconductor substrate 5 are measured. Furthermore, temperatures in the area (indicated by an alternate long and short dashed line 13) up to the right end of the semiconductor substrate 5 are measured. Every time the galvano scanner 75 radially scans the semiconductor substrate 5 once, the mirror block MB is rotated through a predetermined angle about the optical axis OX. As indicated by broken lines S1 to S8 in FIG. 35, the galvano scanner 25 scans the semiconductor substrate 5 in rotational symmetry about the rotational axis N. More specifically, polar coordinate scanning can be performed by one-dimensional scanning of the galvano scanner 75 and image rotation by the mirror block MB.

Optical energy from the semiconductor substrate 5 is incident on the detector 11 through the temperature measurement focusing system 70, and temperatures on the surface of the semiconductor substrate 5 can be measured. The microcomputer 41 controls powers of the annular light sources on the basis of the temperature measurement results such that a temperature distribution of the semiconductor substrate 5 can be uniformly controlled.

Any image rotator such as a prism or a reflecting mirror may be inserted in an optical path between the second lens 72 and the relay lens 73, in place of the mirror block MB serving as an image rotating means In such a temperature measuring apparatus, since the radiation energy from the object whose temperature is to be measured is detected by the detector and is measured thereby, radiation energy associated with a known temperature is fetched to measure a reference temperature in the temperature measuring mode. A self-image of a detector for detecting radiation energy for the reference temperature is reflected by a mirror, and the reflected image is detected by the detector The corresponding temperature serves as a reference temperature. A signal derived from the self-image detected by the detector serves as a narcissus signal.

The principle of the temperature measuring system using the narcissus signal will be described with reference to FIGS. 36 and 37.

FIG. 36 shows a temperature measuring apparatus obtained by partially modifying an arrangement of FIG. 34. The lenses 71 to 73 are illustrated as one lens, and lenses 74 are also illustrated as one lens. According to a characteristic feature of the arrangement shown in FIG. 36, a circular member 60 is arranged to be perpendicular to the optical axis OX at a position where the image formation plane P3 is formed. The circular member 60 serves as a field aperture. A circular plane mirror 61 is formed on a surface 61 on the side of the detector 11, as shown in FIG. 37. An intermediate image 5' becomes afocal by the relay lenses 74, is reflected by the scanner 75 comprising the swingable mirror, and is focused on the light-receiving portion of the infrared detector 11 by the condenser lens 79.

The optical axis OX and the light beam of the optical system at the center of the field of view are represented by solid lines. The optical axes light beams at the ends of the field of view are represented by the dash lines. The optical axis and light beams outside the field of view are represented by the phantom dashed lines.

In the temperature measuring optical system (focusing system) having the arrangement described above, the circular member 60 is located at the focal point of the relay lenses 74. For this reason, the optical system between the circular member 60 and the scanner 75 constitutes a telecentric optical system wherein principal light beams indicated by the solid, dash, phantom lines are perpendicular to an intermediate image formation plane P3 including the image 5'. The principal light beam for forming the self image of the detector 11 thereon is perpendicular to the plane mirror 61 formed on the surface 60a of the circular member 60 on the side of the detector. The image of the detector 11 which is reflected by the plane mirror 61, i.e., the narcissus image, is formed again on the, detector 11, thereby obtaining the narcissus signal. Furthermore, The relay lens 74 constitutes a telecentric optical system on the side of the member 60 such that the principal light beam from the substrate 5 is parallel to the optical axis OX.

Figure 35:
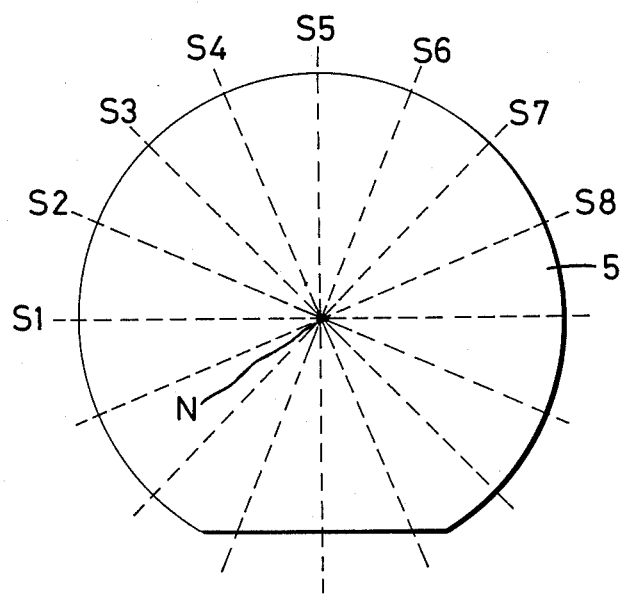
FIG. 35 is a view showing polar coordinate scanning of the temperature measuring system.

The one-dimensional scanner 75, the condenser lens 79, and the infrared detector 11 are integrally held to constitute an optical block OB. The optical block OB can be rotated about the optical axis OX and has an arrangement different from that in FIG. 34 but has the same purpose thereas. The detector 11 is cooled to a predetermined temperature. The narcissus signal can be used as a detection temperature signal and allows the periodic reference of the reference temperature, thereby reducing 1/f noise. Two reference signals can be obtained by single scanning corresponding to one of the lines S1 to S8 (FIG. 35). Therefore, the narcissus signal can also be utilized as a reference signal for the scanning position FIG. 38 shows a detailed arrangement of part of the optical system (FIG. 36) in the temperature measuring apparatus.

Lenses 73 and 74 are inserted in a lens barrel 51. Some of the lenses 73 and 74 are held in holding cylinders 52 and 53. The left end opening of the lens holding cylinder 52 serves as the field aperture. The diameter of the opening is set to be smaller than the left end of the lens holding cylinder 53. A circular mirror 61 is formed on a left end face 52a of the lens holding cylinder 52.

FIG. 39 is a modification of the circular member 60. A black reference temperature portion 62 substantially the same as a black body corresponding to room temperature is formed outside the mirror 61. In the lamp annealing apparatus, the temperature range for possible temperature measurement includes room temperature to 1,000° C. or more, and the output voltage from the detector 11 varies in the wide range including voltages O1 and O2, (FIG. 40). However, if outputs from the detector 11 and the gain of the amplifier are changed, as indicated by intervals g1 to g3 and therefore the gain is not stabilized, a temperature measurement error occurs. A true gain g10 is calculated by using the narcissus signal Vdl, the reference temperature signal Vtl, the known temperature, i.e., room temperature Tt (equal to the temperature of the reference temperature portion 62 and corresponding to the reference temperature signal Vtl), and a detector temperature Td (corresponding to the narcissus signal Vdl) as follows:

$$g10=(Vtl-Vdl)/(Tt-Td) \tag{1}$$

When a temperature is to be obtained on the basis of an output Vwl of the detector 11 upon scanning the semiconductor substrate (i.e., the object subjected to temperature measurement) 5, the true gain g10 is used. Heating for a short period of time is performed as in the lamp annealing apparatus. The temperature Tt of the reference temperature portion 62 and the temperature Td of the detector 11 are regarded as substantially constant, and the true gain g10 can be calculated by equation (1). The temperature can be accurately calculated by the microcomputer 41. In this case, since the values Vd and Vt are determined according to the position of the mirror 75, an output from the detector 11 is sampled by the microcomputer 41 in response to an output from the encoder in the driver 81.

Figure 41:
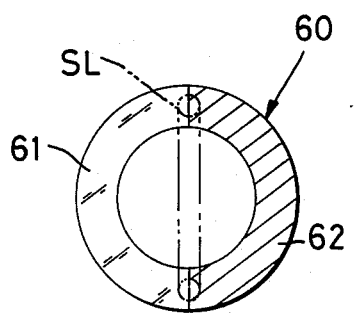
Figure 42:
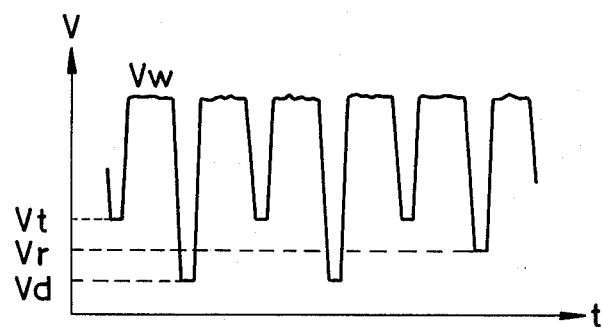

FIG. 41 shows another modification of the circular member 60. The circular member of this modification comprises a mirror 61 on the left half and a reference temperature portion 62 on the right half. According to the circular member 60, the light beam crosses the mirror 61 and the reference temperature portion 62 during one scanning cycle of the scanner 75. For example, when sinusoidal scanning is performed by the scanner 75, a narcissus signal Vd and a reference temperature signal Vt are obtained every predetermined interval. If a scanning track S1 of the scanner 5 passes across the boundary between the mirror 61 and the reference temperature portion 62, the reference signal Vr in FIG. 42 allows positioning or the like of the optical block OB.

Figure 43:
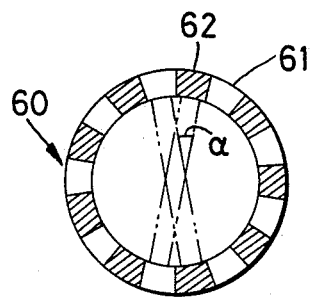

FIG. 43 shows still another modification of the circular member 60. In the circular member of this modification mirrors .61 and black reference temperature portions 62 (indicated by the hatched portions) are alternately formed, as shown in FIG. 43. When the optical block OB is rotated in synchronism with sinusoidal one-dimensional scanning of the scanner 75, the narcissus signal Vd and the reference temperature signal Vt are periodically obtained, as shown in FIG. 44.

Figure 44:
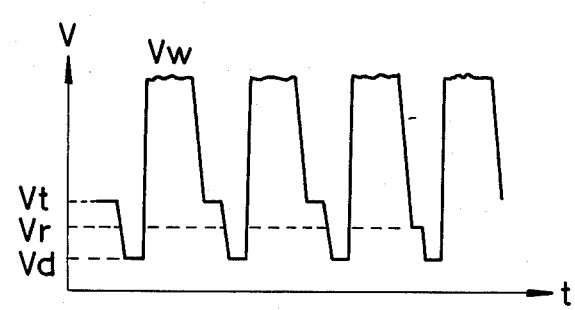
Figure 45:
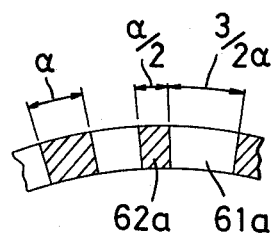
FIG. 45 is a front view showing a further improved arrangement of the annular member.

As shown in FIG. 45, when the angular interval of the mirror portions 61a is larger than that of the black reference temperature portions 62a by a half period ($\alpha/2$), the reference position signal Vr in the rotational direction is obtained, as shown in FIG. 44. In order to obtain a linear scanning track of the sinusoidal scanner 75, the optical block is rotated by a pulse motor while the conjugate image on the detector 11 is located in the reference signal formation area. The number of divisions for giving periodic characteristics is given by $6+4\times P$ (6 is the minimum number of divisions and P is 0 or a natural number). When the pulses of the pulse motor are equally divided, the number of divisions is determined such that a continuous area of mirrors 61 or reference temperature portions 62 is formed. The continuous area has long durations of identical signals, so that a reference position signal in the $\theta$ direction may be constituted.

Figure 46:
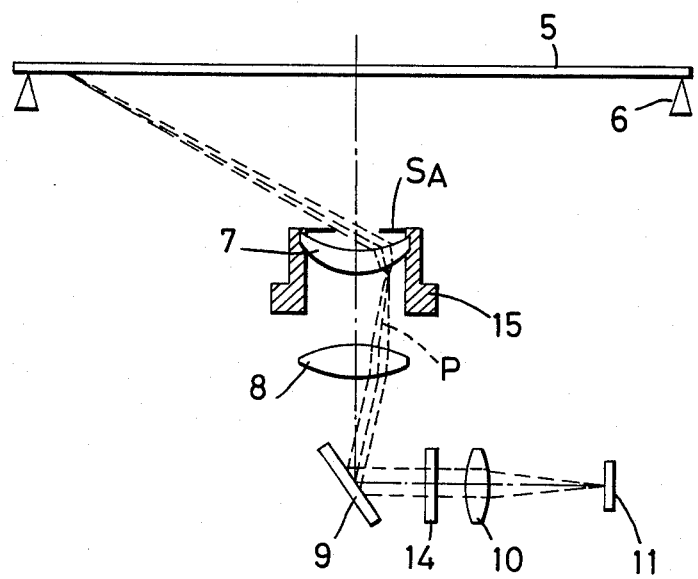
FIG. 46 is a schematic view showing an arrangement wherein a cooling means is arranged in the temperature measuring system.

FIG. 46 shows an improved arrangement of a temperature measuring system in the apparatus according to the present invention. FIG. 46 shows an arrangement based on the arrangement in FIG. 1, and an aperture stop SA, a cooling means 15, and a band-pass filter 14 are added thereto. The cooling means 15 is arranged around the aperture stop SA, and cooling water is always supplied to the cooling means 15 by a circulating system for the cooling means 15 to maintain the aperture stop SA at a predetermined temperature or less.

The band-pass filter 14 is arranged between a mirror 9 and a lens 10 to transmit a beam having a wavelength of 4 μm to 6 μm. Of the radiation beams directed toward the entire surface of the objective lens 7, beams except for ones reaching the opening of the aperture stop SA are shielded. In addition, since heat absorbed by radiation onto the aperture stop SA, can, be eliminated by cooling water of the coaling means 15, temperature errors on the surface of the wafer subjected to measurement by the detector 11 can be prevented. The subsequent members of the temperature measurement optical system are not be heated. The characteristics of the optical system are not changed. Therefore, degradation of performance of the apparatus can be prevented.

Figure 47:
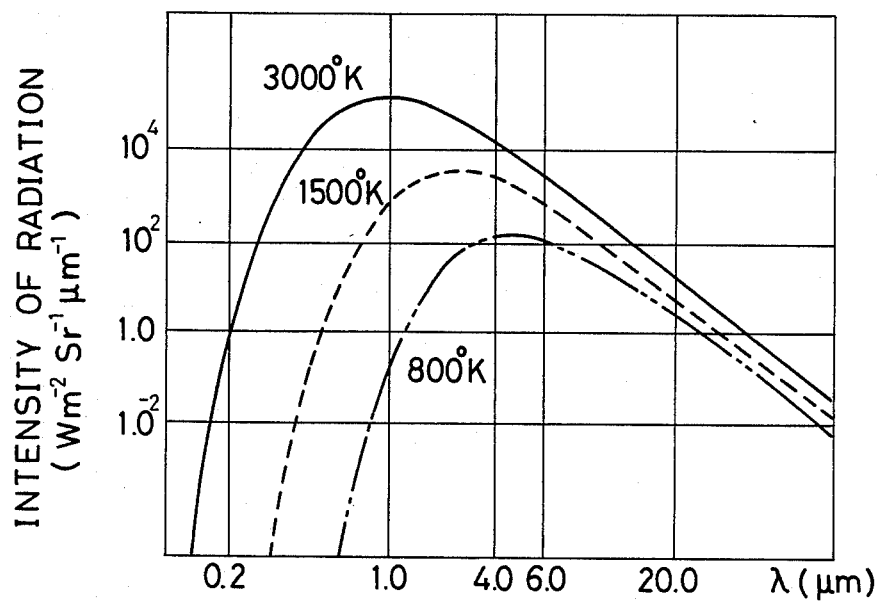
FIG. 47 is a graph showing the Planck's law of radiation.

The annular light source comprises a halogen lamp having a color temperature of about 3,000° K, and the emission spectrum has a distribution indicated by the solid line in FIG. 47 according to the Planck's law of radiation. However, since the wafer or semiconductor substrate 5 is irradiated with a beam from the halogen lamp through a quartz chamber 2, the wafer 5 is heated by beams having wavelengths of 0.3 μm to 3.5 μm, which are the same as those of the quartz transmission range. The object subjected to radiation such as a silicon wafer effectively absorbs beams having a wavelength up to about 1.1 μm. The wafer 5 can be effectively heated by the light beams passing through the quartz chamber. Upon heating of the wafer in the range of 800° K to 1,500° K according to the Planck's law of radiation, the spectrum distribution indicated by the dash line can be changed to the spectrum distribution indicated by the phantom line. The wavelength range of 4 μm to 6 μm is adjusted to the temperature measurement wavelength range by the band-pass filter. Therefore, the wafer temperature can be detected without influence of the radiation beam from the heating annular light source. Therefore, the optical members of the temperature measuring optical system must be formed of a material (e.g., ZnS, ZnSe, CaF$_2$, Ge, or Si) having a high permeability in the temperature measurement wavelength range.

Figure 48:
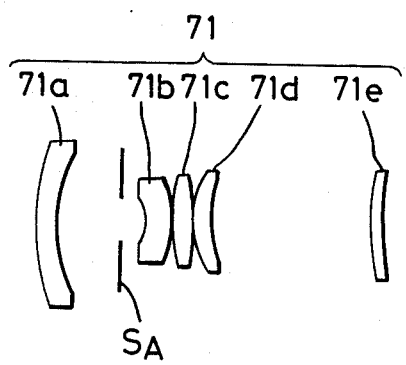
FIG. 48 is a view showing an optical path when the cooling means is arranged in the temperature measuring system.

FIG. 48 shows a case wherein an aperture stop SA is located in the arrangement of FIG. 34. The objective lens 71 has a negative meniscus lens 71a, a positive meniscus lens 71b, double-convex positive lens 71c, and positive and negative meniscus lenses 71d and 71e. The meniscus lens 71a is located near a side (i.e., on the side of the wafer 5) of the aperture stop SA and has a convex surface directed toward the wafer side. The meniscus lens 71b is located behind the aperture stop SA and has a concave surface directed toward the aperture stop SA. The meniscus lens 71d has a convex surface directed toward the aperture stop SA. The meniscus lens 71e is located on the side of the aperture stop SA so as to interpose a wafer image therewith. Since the objective lens 71 has the negative meniscus lens 71a on the side (i.e., on the side of the wafer 5) of the aperture opening SA, the objective lens 71 has a very wide field angle. A temperature at the peripheral portion of the wafer 5 can be accurately measured.

The lens members constituting the temperature measuring optical system 70 must be made of a material that satisfactorily transmits all infrared rays having wavelengths falling outside the temperature measurement wavelength range. In particular, the meniscus lens 71a of the objective lens 71 which to the wafer must be made of a material that allows transmission of heating radiation as well as the above-mentioned infrared rays in order to prevent heating upon reception of the heating radiation. For this reason, a material of the meniscus lens 71a closest to the wafer is preferably selected from ZnS (zinc sulfide), ZnSe (zinc selenium) and CaF$_2$ (calcium fluoride). In this embodiment, ZnS is selected from the ZnS and ZnSe which have relatively high thermal conductivities. The material having a relatively high thermal conductivity is used in the lens closest to the wafer because heat exchange during cooling of the lens by an aperture stop cooling means (to be described later) and a lens heating preventive effect can be improved. A thin film is formed on the surface of the meniscus lens 71a to transmit a beam having a temperature measurement wavelength range of 4 to 6 μm and reflect a heating radiation beam having a wavelength of 1.1 μm or less. Influences of heating radiation need not be considered for the lenses following the meniscus lens 71a. In order to improve focusing performance, a material having a high birefringence is selected. Ge (germanium) is employed for the positive lens, and ZnS is employed for the negative lens 71b and the meniscus lenses in the lenses 73 and 74.

Figure 49:
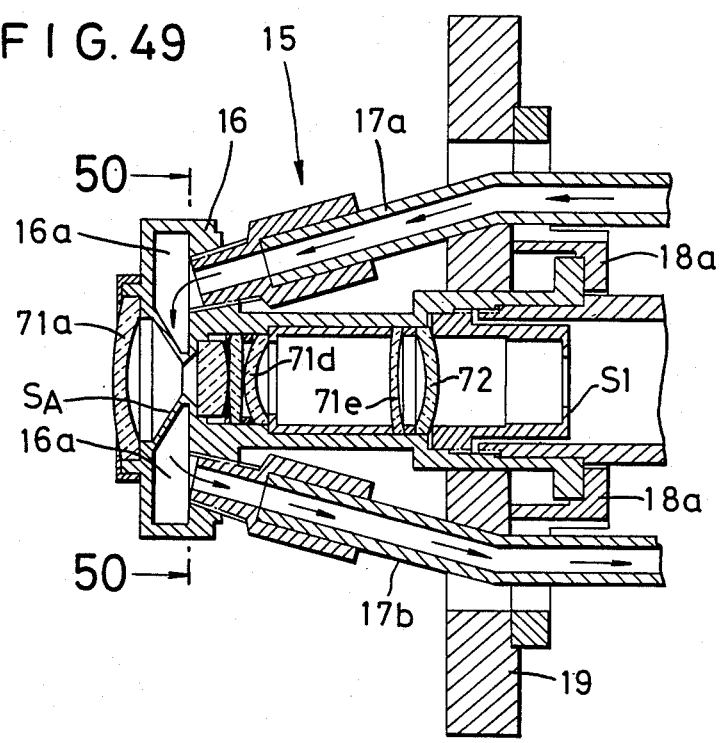
FIG. 49 is a sectional view showing the detailed arrangement of the cooling means shown in FIG. 48.
Figure 50:
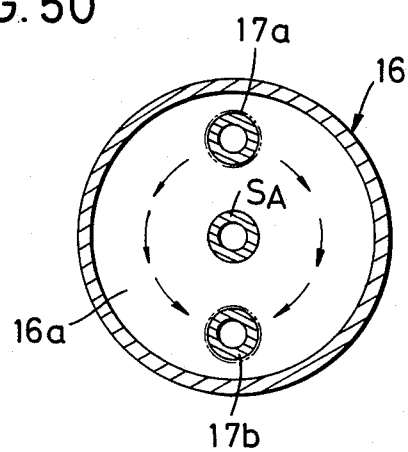
FIG. 50 is a sectional view showing the arrangement of FIG. 49 when taken along the line 50—50.

FIG. 49 is a sectional view showing a detailed arrangement of the cooling means 15 for the aperture stop SA shown in FIG. 48, and FIG. 50 is a sectional view thereof taken along the line 50—50 of FIG. 49. Cooling water supplied from a cooling water pipe 17a is injected in a hollow portion 16a in a cooling cylinder 16 for supporting, the aperture stop SA and the negative meniscus lens 71a (of the objective lens) closest the wafer, as indicated by arrows. Water is branched around the aperture stop SA and is drained in a drain pipe 17b. Water is then cooled through a heat exchanger (not shown) and is circulated again into the water pipe 17a. The cooling cylinder 16 is formed of a metal such as copper having a high thermal conductivity and can efficiently exchange heat with respect to the cooling water as a coolant. The aperture stop SA constitutes a conical surface defining the hollow portion 16a in the cooling cylinder 16. The aperture stop SA absorbing heat of the heating radiation shielded by the conical surface is cooled by the cooling water supplied to the hollow portion 16a and is thus kept at a predetermined temperature. The support of the negative meniscus lens 71a located nearest the wafer also serves as a side surface defining the hollow portion 16a of the cooling cylinder 16. The meniscus lens 71a can thus be satisfactorily cooled.

With the above arrangement, since a pupil aberration of the objective lens 71 is large, the beams of all field angles are limited at the conjugate position P2 (FIG. 34) of the aperture stop SA. Therefore, a relatively large aperture stop is used for the objective lens. The aperture stop S1 located at the conjugate position P2 of the aperture stop SA serves as a second aperture stop for finally limiting the heating radiation. For this reason, the second aperture stop S1 tends to be heated. As shown in FIG. 49, the second aperture stop S1 can also be cooled to some extent. More specifically, the cooling cylinder 16 supports other lens elements 71b, 71c, 71d and 71e of the objective lens, the lens 72, and the second aperture stop S1 therein and can cool them together. The cooling cylinder 16 is supported on a support plate 19 by a fixing ring 18a. In the above description, the temperature measuring system detects radiation generated by the wafer irradiated with beams from the annular light sources and measures the temperature. However, the following measurement can also be utilized. The wafer may be irradiated with temperature measuring infrared rays from a source different from the annular light sources to measure a temperature of the wafer on the basis of a difference between an amount of infrared rays transmitted through the wafer and the amount of infrared rays from the wafer when the temperature measurement infrared rays are not incident on the wafer.

Figure 51A:
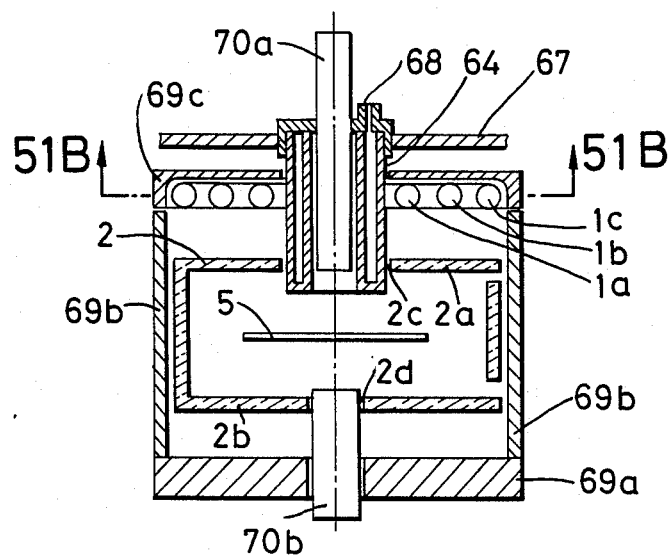
FIGS. 51A and 51B are schematic views of a gas injection apparatus in the apparatus of the present invention which includes a temperature measuring infrared source.
Figure 51B:
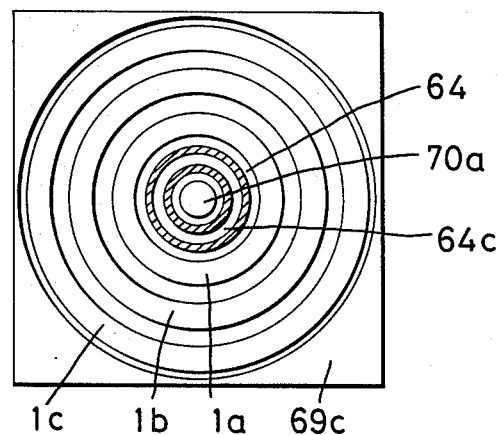
Figure 52A:
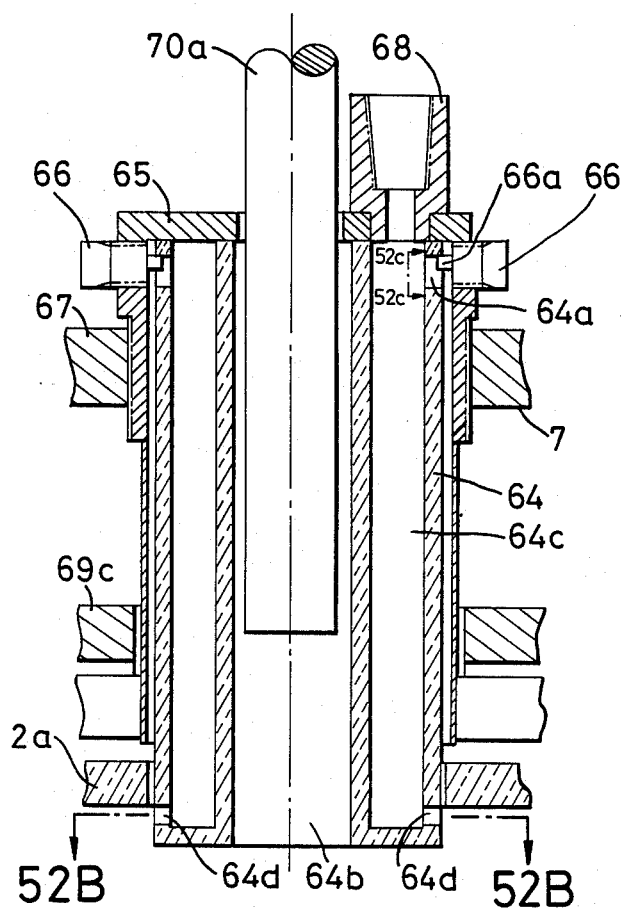
FIGS. 52A, 52B, and 52C are schematic views showing part of the gas injection apparatus.
Figure 52C:
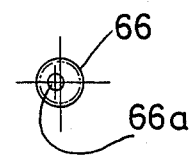

An apparatus for radiating temperature measurement infrared rays onto the wafer will be described with reference to FIGS. 51A and 51B. A through hole 2c is formed in the center of an upper plate 2a in a chamber 2. A lower end of a quartz gas supply cylinder 64 held on the upper support plate 67 is inserted in the gas supply cylinder 64. The gas supply cylinder 64 is mounted to a holding metal member 65 threadably engaged with the upper support plate 67, as shown in FIG. 52A. As shown in FIG. 52C, a projection 66a of an eccentric screw 66 threadably engaged with the holding metal member 65 is inserted into and engaged with a hole 64a of the gas supply cylinder 64 inserted in the holding metal member 65. The eccentric screw 66 is pivoted and urged against the upper surface of the holding metal member 65, thereby holding the gas supply cylinder 64 to the holding metal member 65.

Figure 52B:
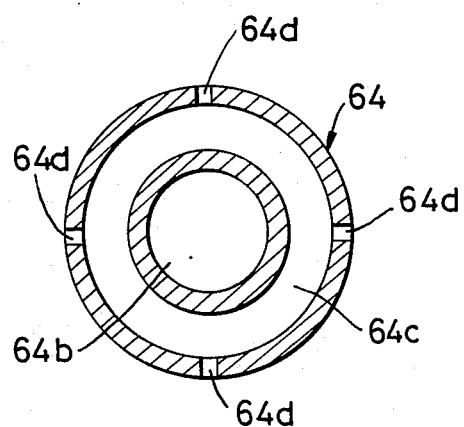

The gas supply cylinder 64 has a double-layered structure, as shown in FIGS. 52A and 52B. An upper lens barrel 70a of the temperature measuring optical system is inserted in a central hole 64b. A ring-like gas supply path 64c is formed around the gas supply cylinder 64. The gas supply cylinder 64 constitutes a gas path to cause the interior of the chamber 2 to communicate with the exterior thereof. An adapter 68 is connected to the upper portion of the gas supply path 64c. As shown in FIG. 52B, gas supply ports 64d are formed in the lower end portion of the gas supply path 64c at equal angular intervals. The gas supply ports 64d normally face the interior of the chamber 2.

A through hole 2d is formed in the center of a lower chamber plate 2b, and a lower lens barrel 70b in the temperature measuring optical system is inserted in the through hole 2d. The lens barrel 70 also extends through a lower support plate 69a. A side mirror 69b is mounted on the lower support plate 69a to surround the outer surface of the chamber 2. An upper mirror 69c is spaced apart from the upper chamber plate 2 by a predetermined distance.

A lens optical system is accommodated in the upper lens barrel 70a in the temperature measuring optical system to guide infrared rays from the temperature measuring infrared lamp to the semiconductor substrate 5. A lens optical system is accommodated in the lower lens barrel 70b to guide radiation infrared rays and temperature measurement transmitted infrared rays to the detector The adapter 68 is connected to a gas supply source to spray the gas from the gas supply port 64d to the chamber 2 through the inlet path 64c. Since the gas flows radially, the temperature gradient is also axially symmetrical. Therefore, the gradient of the atmosphere in the chamber 2 is radial, i.e., axially symmetrical.

A temperature, measuring scanning mechanism (FIG. 34) is provided in the lower lens barrel 70b to scan the surface of the semiconductor substrate 5. The heating temperature can therefore be detected on a real time basis. The powers for the annular light sources 1a to 1c are controlled to substantially uniformly heat the semiconductor substrate 5 on the basis of the measurement results. The heating conditions for the semiconductor substrate 5 are not adversely affected due to the temperature gradient atmosphere in the chamber 2 which is caused by a gas flow.

The size and number of gas inlet ports 64d are properly determined in accordance with the sizes of the chamber and the semiconductor substrate. The apparatus shown in FIG. 51A is intended to include cases wherein the temperature measuring scanning mechanism shown, in FIG. 34 is mounted in the upper lens barrel 70a, and the temperature measuring infrared source is mounted in the lower lens barrel 70b.

As shown in FIG. 53A and 53B, gas inlet ports 64e may be formed at the end portion of the inner cylindrical wall of the gas supply cylinder 64 to decrease a temperature difference between the center of the semiconductor substrate 5 and the peripheral portion thereof, caused by gas spraying.

As shown in FIGS. 54A and 54B, a sealed chamber 90 may be formed by integrally forming a chamber 2 and a gas supply cylinder 64. A through hole 91 for the temperature measurement optical system lens barrel is formed in the center of the chamber 90. Gas supply ports 92a to 92c and gas supply ports 93a to 93c are formed around the through hole 91 at equal angular intervals. Axially extending gas supply paths 94 and axially extending gas supply paths 95 respectively communicate with the gas supply ports 92a to 92c and the gas supply ports 93a to 93c, and gas spray and exhaust ports 96 and 97 are formed thereunder.

The chamber 90 is a sealed chamber and can be effectively used when a reactive toxic gas is used. A seal member is inserted between a lens barrel (not shown) and the through hole 91 to seal the chamber 90.

In the above description, supply of a gas into the chamber during heating is exemplified. However, when a gas is supplied to cool the semiconductor substrate 5 or the like after heating, the same gas supply cylinder as described above may be used. In the structure shown in FIGS. 53A and 53B, the gas may be introduced into the chamber 2 before heating, and the gas supply ports 64d are moved upward until they face the space between the chamber 2 and the annular light source 1. In this case, the cooling gas may be supplied to the side mirror 69b and the upper lens barrel 70a.

Figure 55:
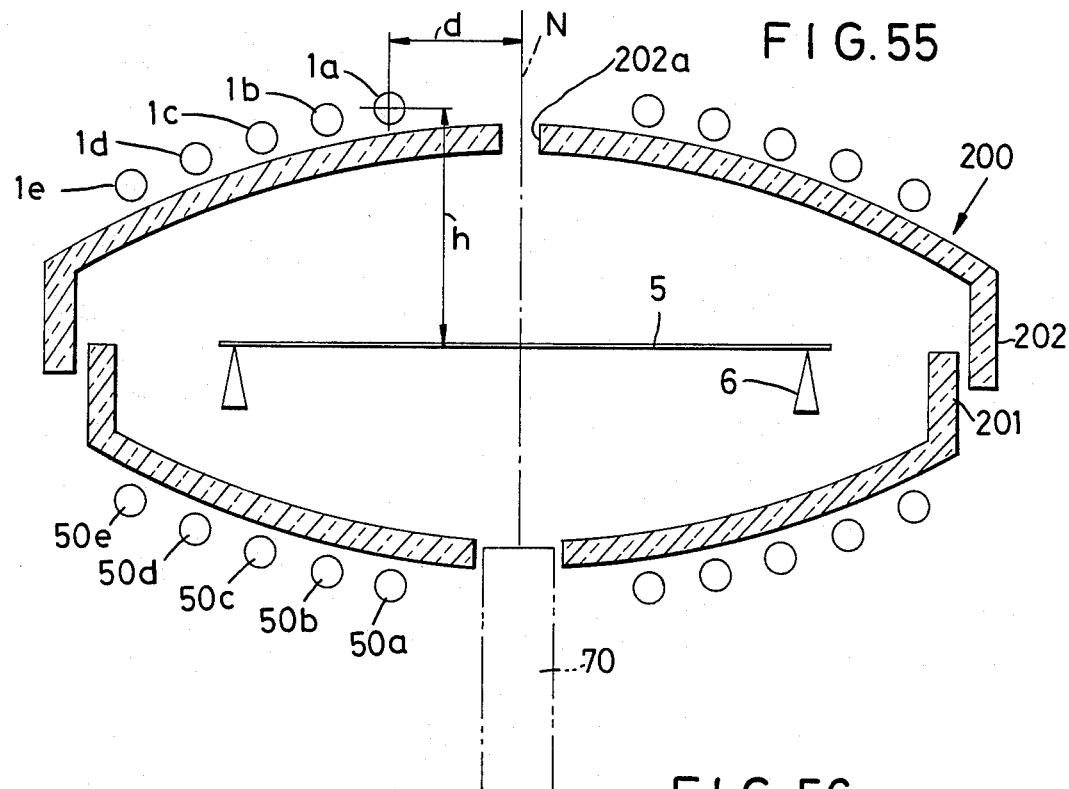
FIGS. 55 and 56 are views showing improved arrangements of the chamber of the apparatus according

FIG. 55 shows an improved arrangement of the chamber of the apparatus according to the present invention. A chamber 200 is constituted by lower and upper chambers 201, and 202 made of quartz in a dome-like shape (hemispherical shape) to improve resistance to vacuum pressure. Since annular light sources 1a to 1e and light sources 50a to 50e are arranged along the outer surfaces of the upper and lower chambers 202 and 201, the distance between the annular light sources and the semiconductor substrate is decreased at light source positions away from the axis N. It should be noted that reference symbol d denotes a radius of the annular light source, and that h is a distance between the annular light source and the semiconductor substrate.

A gas intake port 202a is formed in the center of the upper chamber 202, and an exhaust port (not shown) is formed between the contact surfaces of the chambers 201 and 202. A hole is formed in the center of the lower chamber and a temperature measuring system 70 is inserted in this hole.

The relationship between the output power from the annular light source and heating energy applied to the semiconductor substrate will be described below.

Table 10 shows illuminance ratios on a semiconductor substrate when the semiconductor substrate having a diameter of 10" (200 mm) is heated by the photo annealing apparatus shown in FIG. 55 and characterized as in Table 9.

As shown in Tables 9 and 10 when the light emission weights of all annular light sources are set to 1.0 each, the illuminance ratio near a 70% radial position is as low as 1.046. The illuminance ratio at the peripheral portion is almost the same as that of the central portion. In this case, substantially uniform heating energy is applied to the semiconductor substrate. The heat dissipation level of the peripheral portion is generally higher than that of the central portion. The radiation conditions are set such that the heating energy level is gradually increased toward the peripheral portion. When the innermost annular light source 1a is turned off, as shown in Table 11, for example the illuminance ratio at the peripheral portion is 1.207, as shown in Table 12. Therefore, it is possible to heat the peripheral portion with high heating energy. The output powers of the annular light sources are properly changed on the basis of the temperature data detected by the detector. Therefore, the entire surface of the semiconductor substrate can be heated with a uniform temperature profile. This indicates that semiconductor substrates having different properties between lots of various semiconductor substrates and prepared according to different processes can be annealed under different temperature conditions.

When a plurality of annular light sources are arranged in a planar pattern, as indicated in Table 13, illuminance ratio data shown in Table 14 can be obtained. Tables 9 and 13 are obtained such that the temperature measurement light beams from the temperature measurement optical system do not interfere with the heating beams from the annular light sources and that a distance between the objective lens and the semiconductor substrate is predetermined to obtain a given field angle of the objective lens in the temperature measuring optical system. The illuminance distribution in Table 13 can be substantially uniform. However, heating efficiency in a chamber 200 shown in FIG. 55 is better than that in Table 13 by 1.333 times.

Referring to FIG. 55, a distance between the semiconductor substrate and the temperature measurement optical system objective lens having the predetermined field angle is predetermined to allow scanning of identical areas. In this case, the apparatus in FIG. 55 has better heating efficiency. If identical heating efficiency levels are employed, in the apparatus in FIG. 55, the distance between the objective lens and the semiconductor substrate can be increased and an objective lens having a small field angle is required to scan a given area. Therefore, design and fabrication of the objective lens in the temperature measurement optical system can be made easy.

Figure 56:
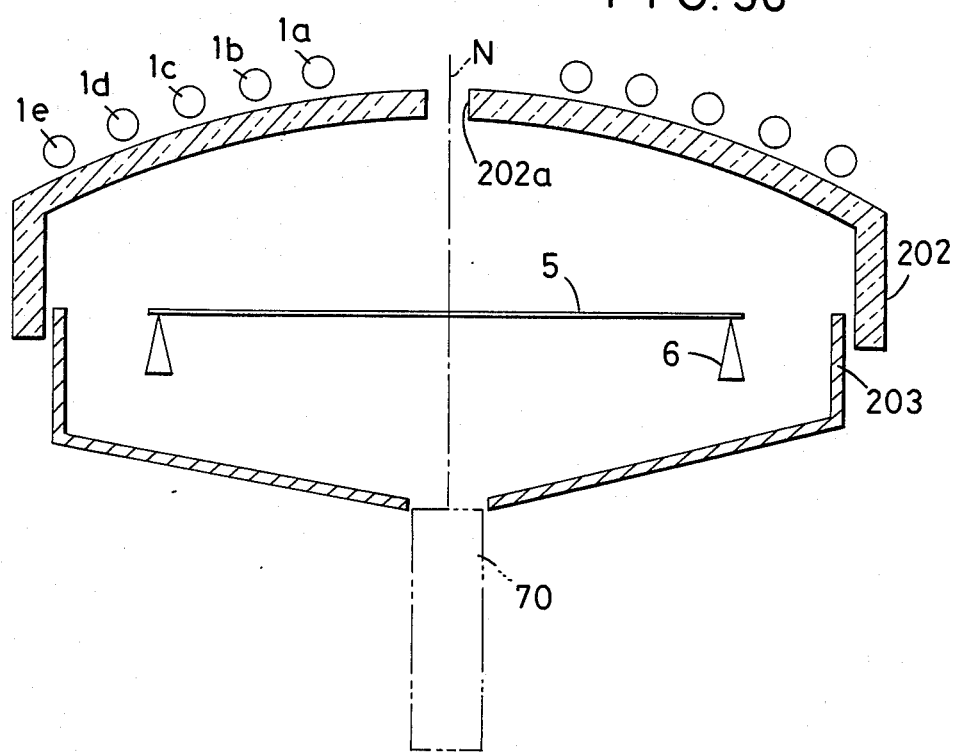

FIG. 56 shows a modification of the chamber shown in FIG. 55. This modification can be applied when an annealing temperature is not higher than that in FIG. 55 or when the residual distortion of the semiconductor substrate is relatively small. In this case, even if the heating annular light sources are arranged near one major surface of the semiconductor substrate, distortion after annealing is small. As shown in FIG. 56, a lower chamber 203 may be made of stainless steel, and an upper chamber 202 may be formed of quartz in the same manner as in FIG. 55. In this case, annular light sources 1a to 1e are arranged above only the upper chamber 202. A temperature measuring system 70 is arranged in the central portion of the lower chamber 203.

TABLE 9

| Radius d (mm) | Height h (mm) | Emission Weight | Light Source Length (mm) |
| --- | --- | --- | --- |
| 43 | 76.95 | 1.0 | 270 |
| 65 | 72.99 | 1.0 | 408 |
| 87 | 67.33 | 1.0 | 547 |
| 109 | 59.86 | 1.0 | 685 |
| 131 | 50.43 | 1.0 | 823 |
| Total Optical Source Length | | | 2733 |

TABLE 10

| Distance from Center of Wafer | 0 mm | 10 mm | 20 mm | 30 mm |
| --- | --- | --- | --- | --- |
| Illuminance Ratio | 1.000 | 1.001 | 1.007 | 1.016 |
| Distance from Center of Wafer | 40 mm | 50 mm | 60 mm | 70 mm |
| Illuminance Ratio | 1.027 | 1.036 | 1.043 | 1.046 |
| Distance from Center of Wafer | 80 mm | 90 mm | 100 mm | |
| Illuminance Ratio | 1.041 | 1.029 | 1.004 | |

TABLE 11

| Radius d (mm) | Height h (mm) | Emission Weight | Light Source Length (mm) |
| --- | --- | --- | --- |
| 43 | 76.95 | 0.0 | 270 |
| 65 | 72.99 | 1.0 | 408 |
| 87 | 67.33 | 1.0 | 547 |
| 109 | 59.86 | 1.0 | 685 |
| 131 | 50.43 | 1.0 | 823 |
| Total Optical Source Length | | | 2733 |

TABLE 12

| Distance from Center of Wafer | 0 mm | 10 mm | 20 mm | 30 mm |
| --- | --- | --- | --- | --- |
| Illuminance Ratio | 1.000 | 1.005 | 1.021 | 1.047 |
| Distance from Center of Wafer | 40 mm | 50 mm | 60 mm | 70 mm |
| Illuminance Ratio | 1.080 | 1.117 | 1.154 | 1.186 |
| Distance from Center of Wafer | 80 mm | 90 mm | 100 mm | |
| Illuminance Ratio | 1.208 | 1.216 | 1.207 | |

TABLE 13

| Radius d (mm) | Height h (mm) | Emission Weight | Light Source Length (mm) |
| --- | --- | --- | --- |
| 61 | 80 | 1.0 | 383 |
| 83 | 80 | 1.0 | 522 |
| 105 | 80 | 1.0 | 660 |
| 127 | 80 | 1.0 | 798 |
| 149 | 80 | 1.0 | 936 |
| Total Optical Source Length | | | 3299 |

TABLE 14

| Distance from Center of Wafer | 0 mm | 10 mm | 20 mm | 30 mm |
| --- | --- | --- | --- | --- |
| Illuminance Ratio | 1.000 | 1.002 | 1.010 | 1.022 |
| Distance from Center of Wafer | 40 mm | 50 mm | 60 mm | 70 mm |
| Illuminance Ratio | 1.035 | 1.048 | 1.057 | 1.059 |
| Distance from Center of Wafer | 80 mm | 90 mm | 100 mm | |
| Illuminance Ratio | 1.052 | 1.036 | 1.009 | |

What is claimed is:

1. An apparatus for annealing a substrate, including:
   (a) a plurality of annular light source means concentric about a predetermined axis;
   (b) placing means for placing the substrate such that the substrate receives radiation from said plurality of annular light source means and is substantially perpendicular to the predetermined axis; and
   (c) measuring means having a measuring optical system with an optical axis substantially aligned with the predetermined axis, said measuring means being adapted to receive radiation through said measuring optical system from the substrate placed on said placing means and to detect a temperature distribution of the substrate, wherein said measuring means comprises scanning means for scanning the substrate placed on said placing means in a plurality of directions perpendicular to the predetermined axis.

2. An apparatus according to claim 1, further comprising housing means for receiving the substrate placed on said placing means and means arranged around said measuring optical system to inject a desired gas to said housing means.

3. An apparatus according to claim 1, wherein said measuring means generates an output corresponding to the temperature distribution of the substrate, and said apparatus further comprising means for controlling amounts of radiation generated by said plurality of annular light source means in response to an output from said measuring means.

4. An apparatus according to claim 1, wherein said measuring means comprises radiation detecting means for detecting an intensity of the radiation from the substrate through said measuring optical system and temperature detecting means for detecting a temperature in response to an output from said radiation detecting means, and said measuring optical system sets said radiation detecting means conjugate with the substrate placed on said placing means.

5. An apparatus according to claim 4, wherein said measuring optical system comprises an objective lens for forming an image of the substrate placed on said placing means and aperture means for limiting an amount of radiation incident from said objective lens onto said radiation detecting means, and said apparatus further comprising means for cooling said aperture means.

6. An apparatus according to claim 4, wherein said measuring means comprises an aperture member arranged in an image formation plane in said measuring optical system between said placing means and said radiation detecting means, said aperture member having a reflecting surface for reflecting the radiation to a side of said radiation detecting means.

7. An apparatus according to claim 6, wherein said measuring means comprises scanning means for causing said radiation detecting means to detect the reflected light of the radiation which is reflected by said reflecting surface of said aperture member, and said temperature detecting means detects the temperature of the substrate on the basis of an output from the radiation detecting means which said radiation detecting means produces in response to the reflected light of the radiation by said reflecting surface.

8. An apparatus according to claim 6, wherein said measuring optical system comprises a telecentric optical system for setting said aperture member conjugate with said radiation detecting means and for collimating principal beams of the radiation from said radiation detecting means in a direction substantially parallel with the optical axis on a side of said aperture member.

9. An apparatus according to claim 8, wherein said aperture member is arranged such that said reflecting surface is substantially perpendicular to the optical axis of said measuring optical system.

10. An apparatus for annealing a substrate, including:
   (a) a plurality of annular light source means concentric about a predetermined axis, said plurality of annular light source means respectively being provided with at least one non-light-emitting portion which does not generate radiation; and
   (b) placing means for placing the substrate such that the substrate receives radiation from said plurality of annular light source means and is substantially perpendicular to the predetermined axis;
   (c) said plurality of annular light source means being arranged such that said non-light-emitting portions of adjacent ones of said plurality of annular light source means are not aligned in radial direction crossing the predetermined axis.

11. An apparatus according to claim 10, wherein each of said plurality of annular light source means comprises a plurality of arcuate light sources.

12. An apparatus for annealing a wafer, including:
   (a) a plurality of annular light source means concentric about a predetermined axis;
   (b) placing means for placing the wafer at a position which is separate from said plurality of annular light source means by a predetermined distance along said predetermined axis, and such that the wafer receives radiation from said plurality of annular light source means and is substantially perpendicular to the predetermined axis; and
   (c) a reflecting member disposed at a side of said annular light source means remote from said placing means, said reflecting member having reflected surface means for reflecting radiation toward a wafer at said position from one of said plurality of annular light source means that is outermost with respect to said predetermined axis and so that the intensity of the reflected radiation at a peripheral portion of said wafer is higher than the intensity of reflected radiation at a central portion of said wafer.

13. An apparatus according to claim 12, wherein said reflecting surface means reflects radiation from said outermost annular light source means so that the intensity of reflected radiation on said wafer increases gradually outwardly from said predetermined axis.

14. An apparatus according to claim 13, wherein said reflecting surface means comprises a circularly symmetric concave reflecting surface.

15. An apparatus according to claim 14, wherein said outermost annular light source means is deviated toward the predetermined axis with respect to the optical axis of the concave reflecting surface.

16. An apparatus according to claim 14, wherein said reflecting surface means comprises a plurality of circularly symmetric concave reflecting surfaces respectively corresponding to said plurality of annular light source means.

* * * * *